United States Patent
Hanzawa et al.

(10) Patent No.: US 12,375,835 B2
(45) Date of Patent: Jul. 29, 2025

(54) SENSING DEVICE, SIGNAL PROCESSING SYSTEM, AND METHOD OF CONTROLLING SENSING DEVICE

(71) Applicant: Sony Semiconductor Solutions Corporation, Kanagawa (JP)

(72) Inventors: Katsuhiko Hanzawa, Kanagawa (JP); Anas Bostamam, Santa Clara, CA (US); Futami Shinichiro, Belgium (GB)

(73) Assignee: Sony Semiconductor Solutions Corporation, Kanagawa (JP)

( * ) Notice: Subject to any disclaimer, the term of this patent is extended or adjusted under 35 U.S.C. 154(b) by 748 days.

(21) Appl. No.: 17/766,604

(22) PCT Filed: Jul. 13, 2020

(86) PCT No.: PCT/JP2020/027226
§ 371 (c)(1),
(2) Date: Apr. 5, 2022

(87) PCT Pub. No.: WO2021/070440
PCT Pub. Date: Apr. 15, 2021

(65) Prior Publication Data
US 2023/0188872 A1 Jun. 15, 2023

Related U.S. Application Data

(60) Provisional application No. 62/912,100, filed on Oct. 8, 2019.

(51) Int. Cl.
*H04N 25/78* (2023.01)
*H04N 25/40* (2023.01)
(Continued)

(52) U.S. Cl.
CPC .............. *H04N 25/78* (2023.01); *H04N 25/40* (2023.01); *H04N 25/703* (2023.01);
(Continued)

(58) Field of Classification Search
CPC ......... G06V 10/10; G06T 1/0007; G06T 9/00; H04N 25/78; H04N 25/40; H04N 25/703;
(Continued)

(56) References Cited

U.S. PATENT DOCUMENTS

| 2002/0106129 A1* | 8/2002 | Yadid-Pecht | H04N 25/40 348/E3.018 |
|---|---|---|---|
| 2005/0122399 A1* | 6/2005 | Silverbrook | G06K 7/14 348/E5.055 |

(Continued)

FOREIGN PATENT DOCUMENTS

| JP | 2015141541 A | 8/2015 |
|---|---|---|
| JP | 2016005240 A | 1/2016 |

(Continued)

OTHER PUBLICATIONS

International Search Report (PCT/ISA/210), International Application No. PCT/JP2020/027226, dated Sep. 15, 2020.

*Primary Examiner* — Phuoc Tran
(74) *Attorney, Agent, or Firm* — Michael Best & Friedrich LLP

(57) ABSTRACT

In a sensing device that retains a code indicating access destinations, a data amount of the code is reduced.
In a pixel array unit, a plurality of areas each include a predetermined number of pixels are arrayed. A reference access code retention unit retains a reference access code for designating, as access destinations, some of the pixels in a specific area among the plurality of areas. A non-reference access code generation unit generates a non-reference access code for designating, as access destinations, the pixels in an
(Continued)

area which does not correspond to the specific areas among the plurality of areas from the reference access code. A signal processing unit generates pixel data of pixels designated with the reference access code and the non-reference access code.

15 Claims, 32 Drawing Sheets

(51) Int. Cl.
| | |
|---|---|
| *H04N 25/703* | (2023.01) |
| *H04N 25/77* | (2023.01) |
| *H04N 25/11* | (2023.01) |
| *H04N 25/60* | (2023.01) |
| *H10F 39/00* | (2025.01) |

(52) U.S. Cl.
CPC ............. *H04N 25/77* (2023.01); *H04N 25/11* (2023.01); *H04N 25/60* (2023.01); *H10F 39/809* (2025.01)

(58) Field of Classification Search
CPC ........ H04N 25/77; H04N 25/11; H04N 25/60; H04N 25/00; H04N 25/44; H10F 39/809
See application file for complete search history.

(56) References Cited

U.S. PATENT DOCUMENTS

| | | | |
|---|---|---|---|
| 2016/0205336 A1* | 7/2016 | Sato | H04N 19/13 348/322 |
| 2019/0353887 A1* | 11/2019 | Riza | G02B 21/367 |
| 2020/0059593 A1* | 2/2020 | Zhou | H04N 23/45 |

FOREIGN PATENT DOCUMENTS

| | | |
|---|---|---|
| JP | 2016131363 A | 7/2016 |
| JP | 2017069948 A | 4/2017 |
| JP | 2019130307 A | 8/2019 |

* cited by examiner a b a b a b a b a b a b a b a b a b a b

SENSING DEVICE, SIGNAL PROCESSING SYSTEM, AND METHOD OF CONTROLLING SENSING DEVICE

TECHNICAL FIELD

The present technology relates to a sensing device. More specifically the present technology relates to a sensing device that performs compressed sensing, a signal processing system, and a method of controlling the sensing device.

BACKGROUND ART

In recent years, a technology called compressed sensing has attracted attention in sensing devices such as solid-state image sensors. Compressed sensing is a technology for recovering high-dimensional data (data of all pixels or the like) with a sparse property from less observation data (data of some pixels or the like). In particular, in solid-state image sensors, some pixel data selected at random is read as observation data to prevent frequency components from being biased. For example, an imaging device that retains a code in which a plurality of bits are arrayed in a 2-dimensional lattice form in registers, reads pixel data corresponding to the bits indicating access destinations in the code, and further performs pixel addition has been proposed (for example, see PTL 1).

CITATION LIST

Patent Literature

[PTL 1]
JP 2016-005240 A

SUMMARY

Technical Problem

In the above-described technologies of the related art, a reduction in a data amount of an image and an improvement in sensitivity are achieved through pixel addition. However, in the above-described imaging device, there is a problem in that a data amount of the code indicating access destinations increases as the number of pixels increases. As the data amount of the code increases, a memory capacity necessary to retain the code and a communication amount of an interface transmitting the code increase. Therefore, it is desirable to decrease the data amount of the code.

The present technology has been devised in view of such circumstances and an objective of the present technology is to reduce a data amount of a code indicating access destinations in a sensing device retaining the code.

Solution to Problem

The present technology has been devised to solve the above-described problems. A first aspect of the present technology is a sensing device and a method of controlling the sensing device, the sensing device including: a pixel array unit in which a plurality of areas each including a predetermined number of pixels are arrayed; a reference access code retention unit configured to retain a reference access code for designating, as access destinations, some of the pixels in a specific area among the plurality of areas; a non-reference access code generation unit configured to generate a non-reference access code for designating, as access destinations, the pixels in an area which does not correspond to the specific areas among the plurality of areas from the reference access code; and a signal processing unit configured to generate pixel data of pixels designated with the reference access code and the non-reference access code. Accordingly, it is possible to obtain the operational effect that the data amount of the access code is reduced.

In the first aspect, the non-reference access code generation unit may generate the non-reference access code in an area adjacent to the specific area among the plurality of areas. Accordingly, it is possible to obtain the operational effect that the access code of the adjacent area is generated.

In the first aspect, the non-reference access code generation unit may generate the non-reference access code in an area nonadjacent to the specific area among the plurality of areas. Accordingly, it is possible to obtain the operational effect that the access code of the nonadjacent area is generated.

In the first aspect, the non-reference access code generation unit may generate a first non-reference access code from the reference access code in a first area which does not correspond to the specific area, and may generate a second non-reference access code from the first non-reference access code in a second area which does not correspond to the specific area. Accordingly, it is possible to obtain the operational effect that the access codes of the first and second areas are generated in order.

In the first aspect, the non-reference access code generation unit may generate the non-reference access code from the reference access code in a specific area of a second frame. Accordingly, it is possible to obtain the operational effect that the access code is changed for each frame.

In the first aspect, the non-reference access code generation unit may generate the non-reference access code through predetermined calculation processing on the reference access code. Accordingly, it is possible to obtain the operational effect that randomness of the access code is improved.

In the first aspect, the reference access code may include a bit sequence in which a predetermined number of bits are arrayed, and the calculation processing may include processing for inverting each of the bits. Accordingly, it is possible to obtain the operational effect that the randomness is improved through bit-by-bit inversion.

In the first aspect, the reference access code may include a bit sequence in which a predetermined number of bits are arrayed, and the calculation processing may include processing for inverting an order of the bits. Accordingly it is possible to obtain the operational effect that the randomness is improved through bit-order inversion.

In the first aspect, the reference access code may include a bit sequence in which a predetermined number of bits are arrayed, and the calculation processing may include cyclic shifting in the bit sequence. Accordingly, it is possible to obtain the operational effect that the randomness is improved through cyclic shifting.

In the first aspect, the predetermined number of pixels may be arrayed in accordance with a Bayer array. Accordingly, it is possible to obtain the operational effect that a pixel signal is read from the pixel array unit with a Bayer array.

In the first aspect, a shift number of the cyclic shifting may be odd. Accordingly, it is possible to obtain the operational effect that randomness of color is improved.

In the first aspect, the signal processing unit may include a plurality of analog-digital converters converting analog signals coming from the pixels into the pixel data. Accordingly, it is possible to obtain the operational effect that a signal of each pixel is read.

In the first aspect, the plurality of analog-digital converters may convert the analog signals of pixels designated with the reference access code and the non-reference access code into the pixel data. Accordingly, it is possible to obtain the operational effect that only a signal of the pixels of the access destinations is read.

In the first aspect, the signal processing unit may further include a selection unit selecting and outputting pixel data of pixels designated with the reference access code and the non-reference access code among the pixel data of the plurality of analog-digital converters. Accordingly, it is possible to obtain the operational effect that only pixel data of the access destinations is selected.

A second aspect of the present technology is a signal processing system including: a pixel array unit in which a plurality of areas each including a predetermined number of pixels are arrayed; a reference access code retention unit configured to retain a reference access code for designating, as access destinations, some of the pixels in a specific area among the plurality of areas; a non-reference access code generation unit configured to generate a non-reference access code for designating, as access destinations, the pixels in an area which does not correspond to the specific areas among the plurality of areas from the reference access code; a signal processing unit configured to generate pixel data of the pixels designated with the reference access code and the non-reference access code; and a recovery unit configured to recover image data based on the pixel data. Accordingly, it is possible to obtain the operational effect that the data amount of the access code is reduced and the remaining pixel data is recovered from the pixel data of the access destinations.

In the second aspect, the pixel array unit, the reference access code retention unit, the non-reference access code generation unit, and the signal processing unit may be disposed in a sensing device, and the recovery unit may be disposed in an application processor. Accordingly, it is possible to obtain the operational effect that an image is stored by the application processor.

In the second aspect, the pixel array unit, the reference access code retention unit, the non-reference access code generation unit, and the signal processing unit may be disposed in an imaging device, and the recovery unit may be disposed in an information processing device. Accordingly, it is possible to obtain the operational effect that the image data is recovered outside of the imaging device.

In the second aspect, first and second reference access code generation units configured to generate the reference access code may be further included. The pixel array unit, the first reference access code generation unit, the reference access code retention unit, the non-reference access code generation unit, and the signal processing unit may be disposed in an imaging device, and the second reference access code generation unit and the recovery unit may be disposed in an information processing device. Accordingly, it is possible to obtain the operational effect that security is improved.

In the second aspect, a reference access code generation unit configured to generate the reference access code may be further included. The pixel array unit, the reference access code generation unit, the reference access code retention unit, the non-reference access code generation unit, and the signal processing unit may be disposed in a sensing device, and the recovery unit may be disposed in an application processor. Accordingly, it is possible to obtain the operational effect that the image data is recovered based on the reference access code generated by the sensing device.

DESCRIPTION OF EMBODIMENTS

Hereinafter, modes for carrying out the present technology (hereinafter referred to as embodiments) will be described. The description will be made in the following order.

1. First embodiment (example in which access code is newly generated from access code)
2. Second embodiment (example in which access code is newly generated from access code and a digital signal is selected)
3. Third embodiment (example in which access code is newly generated from access code and is recovered from outside)
4. Fourth embodiment (example in which imaging device and information processing device newly generate access code from access code)
5. Fifth embodiment (example in which solid-state image sensor newly generates access code from access code)
6. Modified examples

1. First Embodiment

[Exemplary Configuration of Imaging Device]

Figure 1:
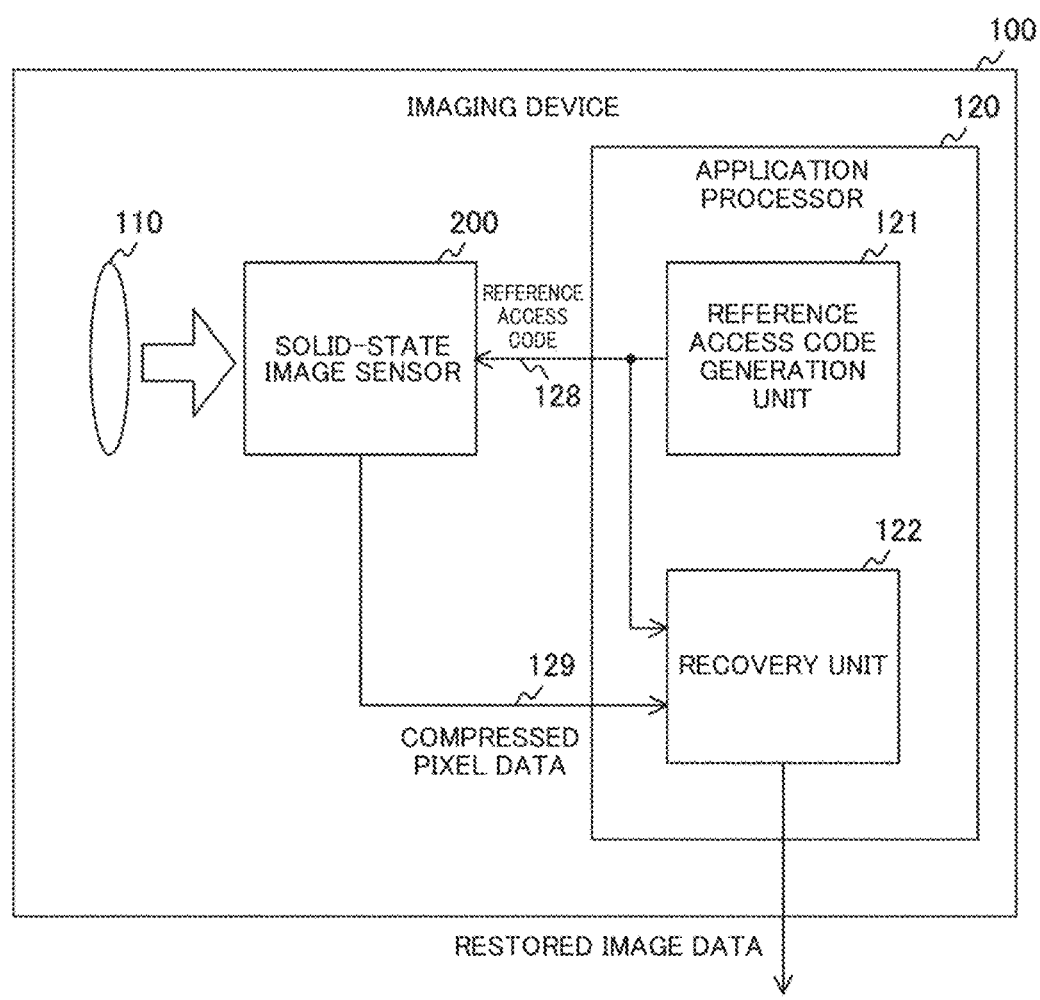
FIG. 1 is a block diagram illustrating an exemplary configuration of an imaging device according to a first embodiment of the present technology.

FIG. 1 is a block diagram illustrating an exemplary configuration of an imaging device 100 according to a first embodiment of the present technology. The imaging device 100 is a device that captures image data and includes an optical unit 110, a solid-state image sensor 200, and an application processor 120.

The optical unit 110 condenses incident light and guides the light to the solid-state image sensor 200.

The solid-state image sensor 200 captures image data through photoelectric conversion. The solid-state image sensor 200 receives a reference access code from the application processor 120. The reference access code is an access code indicating some pixels in a specific area as access destinations. The solid-state image sensor 200 reads some pixel data among all the pixels based on the reference access code. When the ratio of the number of pixels of access destinations to the number of all pixels is 1/n (where n is an integer), a data amount is compressed at 1/n. The solid-state image sensor 200 supplies image data formed from the read pixel data as compressed image data to the application processor 120 via a signal line 129.

The solid-state image sensor 200 is an example of a sensing device described in the claims.

The application processor 120 recovers the image data including all the pixels from the compressed image data. The application processor 120 includes a reference access code generation unit 121 and a recovery unit 122.

The reference access code generation unit 121 selects some pixels in a specific area at random and generates a code indicating these pixels as access destinations as a reference access code. The reference access code generation unit 121 supplies the generated reference access code to the solid-state image sensor 200 via a signal line 128. The reference access code generation unit 121 also supplies the reference access code to the recovery unit 122.

The recovery unit 122 recovers the image data of all the pixels also including pixels other than the access destinations from the compressed image data using a recovery algorithm. The recovery unit 122 outputs the recovered image data to the outside as recovered image data. As the recovery algorithm, for example, an algorithm described in "Kazushi Mimura, 'Compressed Sensing-Sparse recovery and its algorithms' [online], [retrieved on 19 Sep. 2019], Internet (URL: http://www.kurims.kyoto-u.ac.jp/~kyodo/kokyuroku/contents/pdf/11803-03.pdf)" is used.

The solid-state image sensor 200 and the application processor 120 are disposed in the same device (the imaging device), but they may also be disposed in separate devices.

[Exemplary Configuration of Solid-State Image Sensor]

Figure 2:
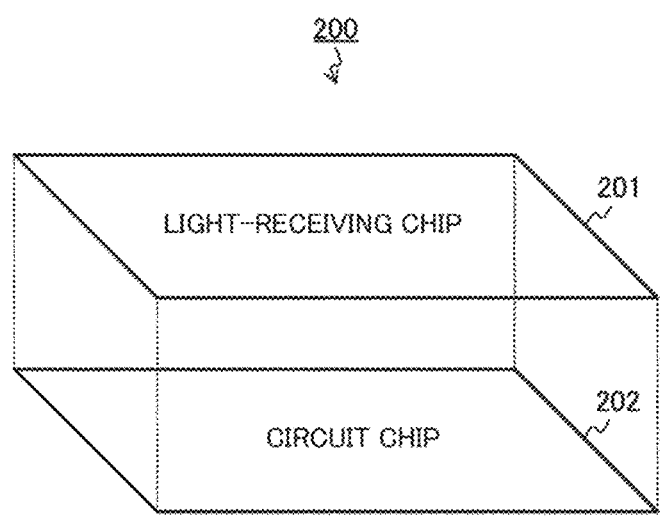
FIG. 2 is a diagram illustrating an example of a laminated structure of a solid-state image sensor according to the first embodiment of the present technology.

FIG. 2 is a diagram illustrating an example of a laminated structure of the solid-state image sensor 200 according to an embodiment of the present technology.

The solid-state image sensor 200 includes a light-receiving chip 201 and a circuit chip 202 laminated on the light-receiving chip 201. Signal lines for transmitting signals are provided between these chips.

Figure 3:
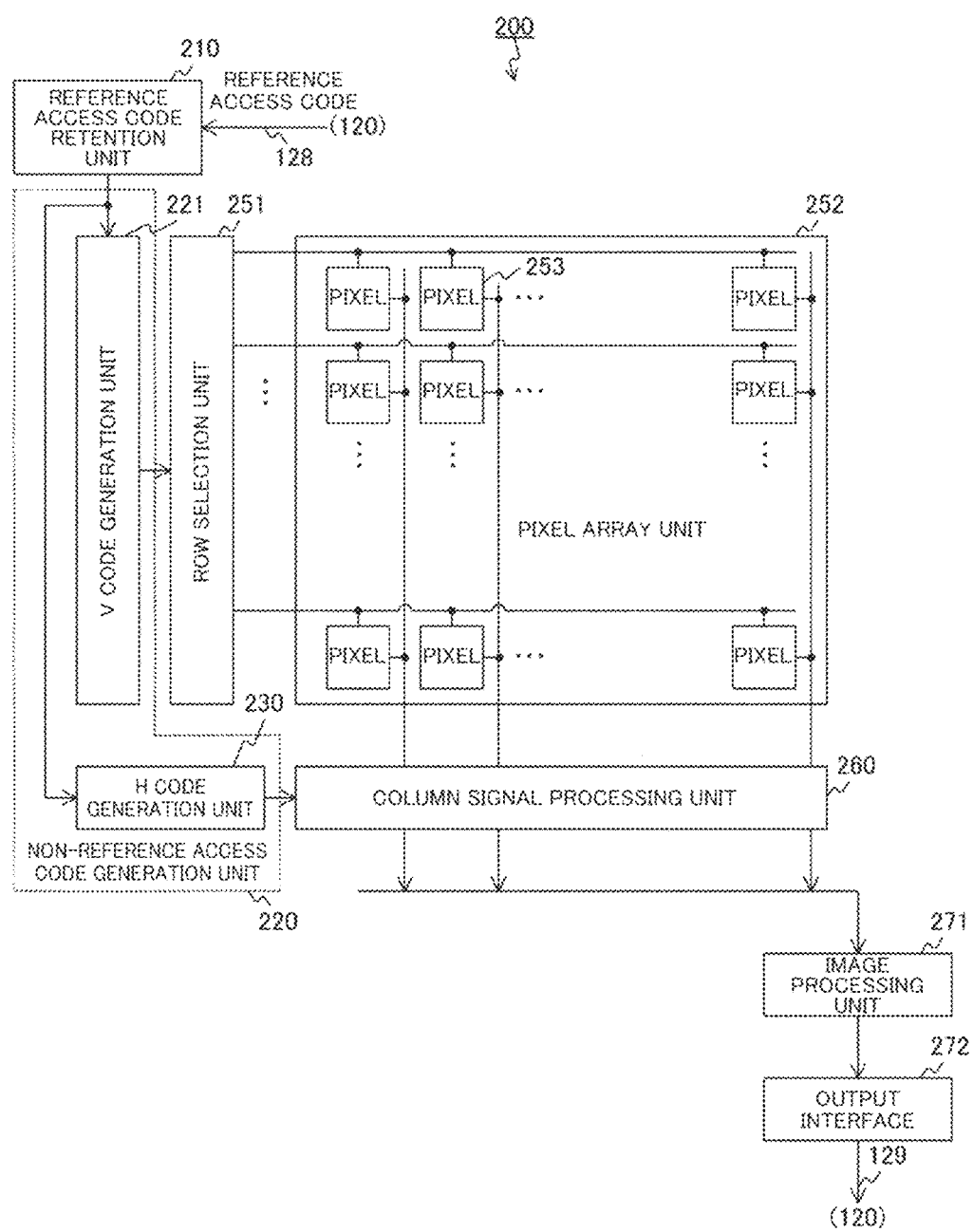
FIG. 3 is a block diagram illustrating an exemplary configuration of the solid-state image sensor according to the first embodiment of the present technology.

FIG. 3 is a block diagram illustrating an exemplary configuration of the solid-state image sensor 200 according to a first embodiment of the present technology.

The solid-state image sensor 200 includes a reference access code retention unit 210, a non-reference access code generation unit 220, a row selection unit 251, a pixel array unit 252, a column signal processing unit 260, an image processing unit 271, and an output interface 272.

In the pixel array unit 252, a plurality of pixels 253 are arrayed in a 2-dimensional lattice form. Three or four transistors are disposed in a circuit of the pixel 253. The number of transistors may be five or more. An electrification domain or a memory of a voltage domain may be provided in the pixel 253 or a transistor switching conversion efficiency may be disposed. The plurality of pixels 253 may or may not share a floating diffusion layer. Alternatively an inorganic or organic photoelectric conversion film can be provided in the pixel 253. Array of color filters of the pixels 253 may be a Bayer array or an array other than the Bayer array. A minimum unit in the array may be a 2-row×2-column or a 3-row×3-column as in a Bayer array. As the color filters, various filters such as primary color filters, complementary filters, or filters through which infrared light passes can be used.

Figure 4:
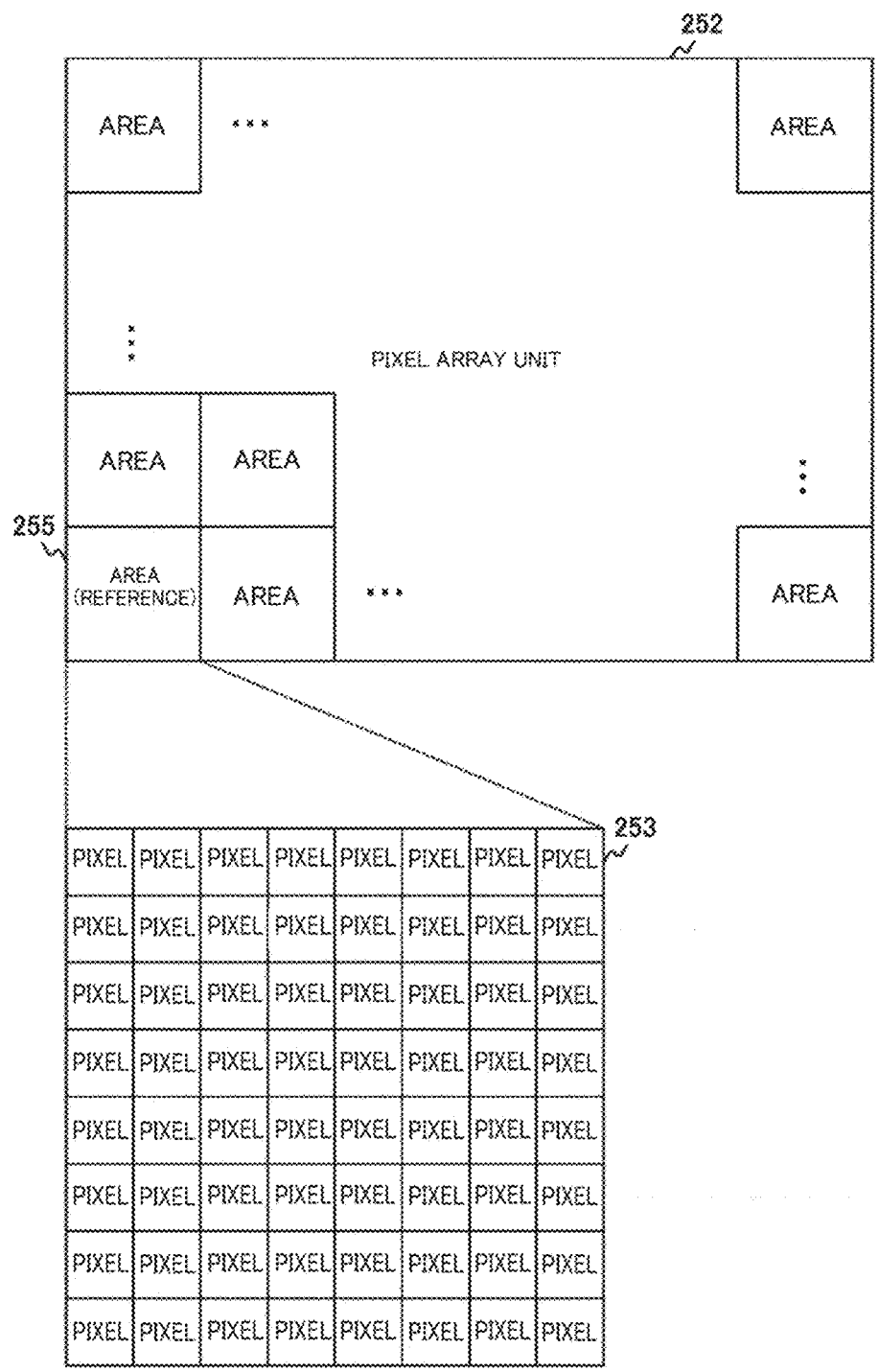
FIG. 4 is a plan view illustrating an exemplary configuration of a pixel array unit according to the first embodiment of the present technology.

In the pixel array unit 252, switches or capacitors in FIG. 4 of JP 2016-005240 A may be added to perform source follower addition. As disclosed in JP 2016-005240 A, averaging may be performed via the capacitors. As the capacitors, auto-zero capacitors used in comparators can be divided and can be mounted by connecting other vertical signal lines.

The reference access code retention unit 210 retains the reference access code generated by the application processor 120. A resistor or the like is used as the reference access code retention unit 210.

The non-reference access code generation unit 220 generates, as a non-reference access code, an access code indicating the pixels in an area other than the specific area as access destinations from the reference access code. The non-reference access code generation unit 220 includes a V code generation unit 221 and an H code generation unit 230. The V code generation unit 221 generates a code indicating rows of the access destinations as a V code based on the access code.

The H code generation unit 230 generates a code indicating columns of the access destinations as an H code based on the access code.

The row selection unit 251 selects the rows of the access destinations in accordance with the V code in the access code (the reference access code or the non-reference access code). The row selection unit 251 drives each of the pixels 253 in the selected rows and outputs an analog pixel signal.

The column signal processing unit 260 performs signal processing such as analog-to-digital (AD) conversion processing or correlated double sampling (CDS) processing on the pixel signals in rows whenever the rows are selected. The column signal processing unit 260 generates pixel data of columns of the access destinations in accordance with an H code in the access code (the reference access code or the non-reference access code) and supplies the pixel data to the image processing unit 271. The column signal processing unit 260 is an example of a signal processing unit described in the claims.

The image processing unit 271 performs image processing such as white balance correction processing or black level correction processing on compressed image data in which pixel data is arrayed. The image processing unit 271 supplies the compressed image data subjected to the image processing to the output interface 72.

The output interface 272 supplies the compressed image data to the application processor 120.

For example, the pixel array unit 252 is disposed in the light-receiving chip 201 and the other circuits are disposed in the circuit chip 202. The circuits disposed in the chips are not limited to this configuration. For example, the circuits until the comparators in the pixel array unit 252 and the column signal processing unit 260 may be disposed in the light-receiving chip 201 and the rear stage may be disposed in the circuit chip 202. Further, a memory chip in which a dynamic random access memory (DRAM) or the like is provided may be added, and thus three or more layers may be laminated. The plurality of chips may not be laminated and each circuit of the solid-state image sensor 200 may be disposed in one chip.

The circuits exemplified in the drawing are provided in the solid-state image sensor 200 (that is, an image sensor), but may be provided in a sensing device such as a ranging sensor other than an image sensor.

FIG. 4 is a plan view illustrating an exemplary configuration of the pixel array unit 252 according to the first embodiment of the present technology. The pixel array unit 252 is divided into a plurality of areas 255. In each of the areas 255, a predetermined number of pixels 253 are arrayed. For example, in each of the areas 255, 64 pixels of 8 rows×8 columns are arrayed. The number of pixels in the area 255 is not limited to 64. For example, in each of the areas 255, 16 pixels of 4 rows×4 columns may be arrayed.

The reference access code is generated in a specific area among the plurality of areas 255. In the drawing, an area in which "(reference)" is written is an area in which the reference access code is applied. Access codes of the other areas other than the specific area are generated through predetermined calculation using an access code of a separate area as a reference.

The row selection unit 251 selects the plurality of areas 255 as an access target one by one in order and selects rows in order in accordance with the V code corresponding to that area.

Figure 5:
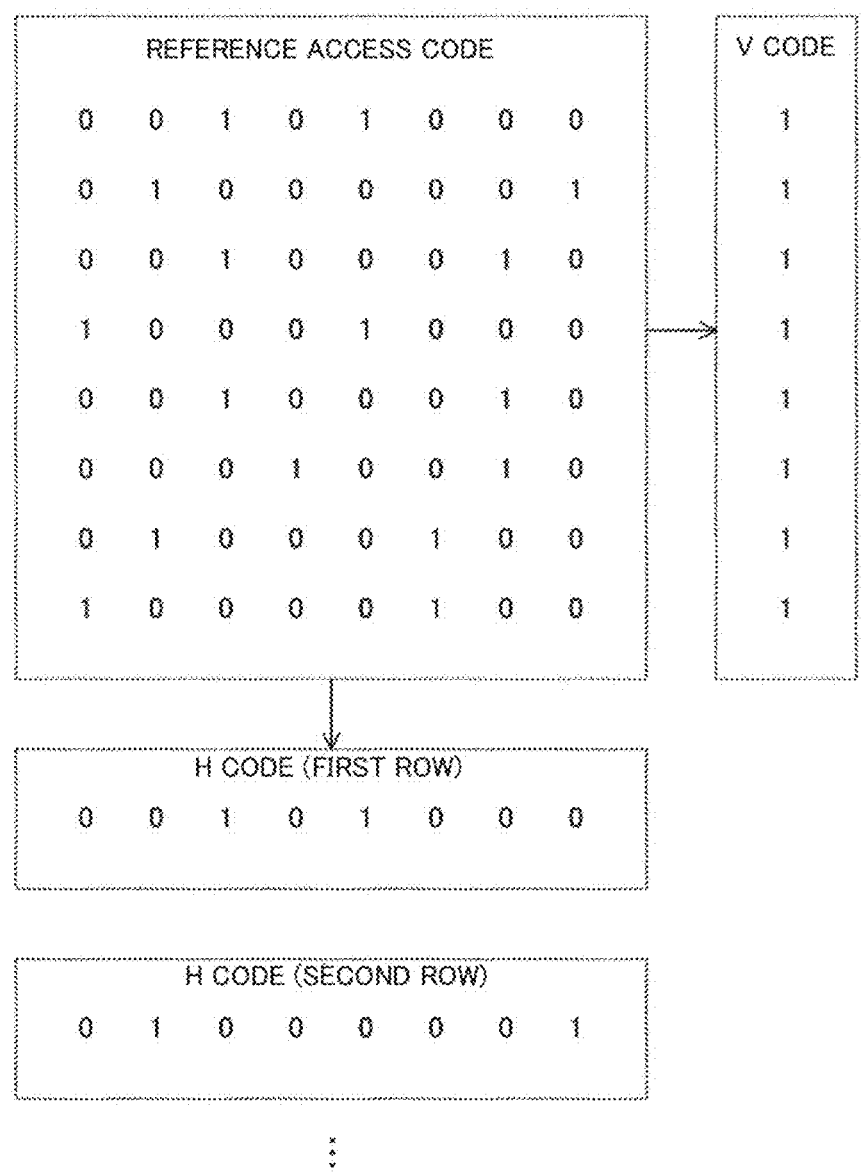
FIG. 5 is a diagram illustrating examples of a reference access code, a V code, and an H code according to the first embodiment of the present technology.

FIG. 5 is a diagram illustrating examples of a reference access code, a V code, and an H code according to the first embodiment of the present technology. The reference access code is a code formed from a matrix in which bits of the same number as the number of pixels in the area 255 are arrayed in a 2-dimensional lattice form. For example, when 64 pixels of 8 rows×8 columns are arrayed in the area 255, a code of 64 bits of 8 rows×8 columns is used as a reference access code. Bits of M rows and N columns (where M and N are integers) indicate whether pixels of M rows and N columns are access destinations. For example, when the pixels are the access destinations, a logical value "1" is set in corresponding bits. When the pixels are not the access destinations, a logical value "0" is set. The pixels of the access destinations are selected at random from 64 pixels by the application processor 120.

The V code generation unit 221 generates a V code from the reference access code. When the logical value "1" is set in bits of the access destinations, the V code generation unit 221 calculate logical OR of all the bits in the row at each row and generates a code in which calculation results are arrayed in the vertical direction as the V code. One 8-bit V code is generated from the reference access code of 8 rows×8 columns.

The H code generation unit 230 generates an HI code from the reference access code. The H code generation unit 230 outputs each of rows in the reference access code as an H code. Eight 8-bit V codes are generated from the reference access code of 8 rows×8 columns. In this say; the reference access code is divided into a plurality of H codes.

Figure 6:
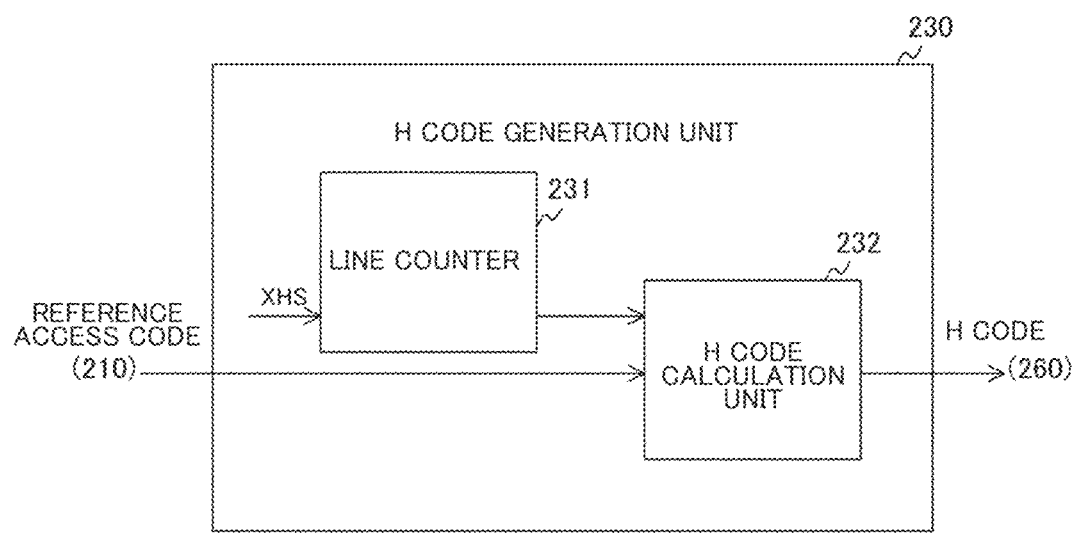
FIG. 6 is a block diagram illustrating an exemplary configuration of an H code generation unit according to the first embodiment of the present technology.

FIG. 6 is a block diagram illustrating an exemplary configuration of the H code generation unit 230 according to the first embodiment of the present technology. The H code generation unit 230 includes a line counter 231 and an H code calculation unit 232.

The line counter 231 counts the number of lines accessed in synchronization with a horizontal synchronization signal XHS. The line counter 231 supplies a counted value to the H code calculation unit 232.

The H code calculation unit 232 generates H codes of a non-reference access code through calculation of H codes of the reference access code. The H code calculation unit 232 determines a position of an access target area based on the counted value from the line counter 231. When the access target area is an area corresponding to the reference access code, the H code calculation unit 232 outputs the rows of the reference access code as the H codes in order.

On the other hand, when the access target area is an area corresponding to the non-reference access code, the H code calculation unit 232 performs predetermined calculation of the H codes of the reference access code and outputs calculation results as H codes of the non-reference access code. As the calculation of the H codes, bit-by-bit inversion, bit-order inversion (in other words, swapping), cyclic shifting, or the like is performed.

The V code generation unit 221 also generates a V code of the non-reference access code through calculation as necessary like the H code generation unit 230. Here, in the V code generation unit 221, there is a case in which the calculation is not necessary in the generation of the V code of the non-reference access code.

[Exemplary Configuration of Column Signal Processing Unit]

Figure 7:
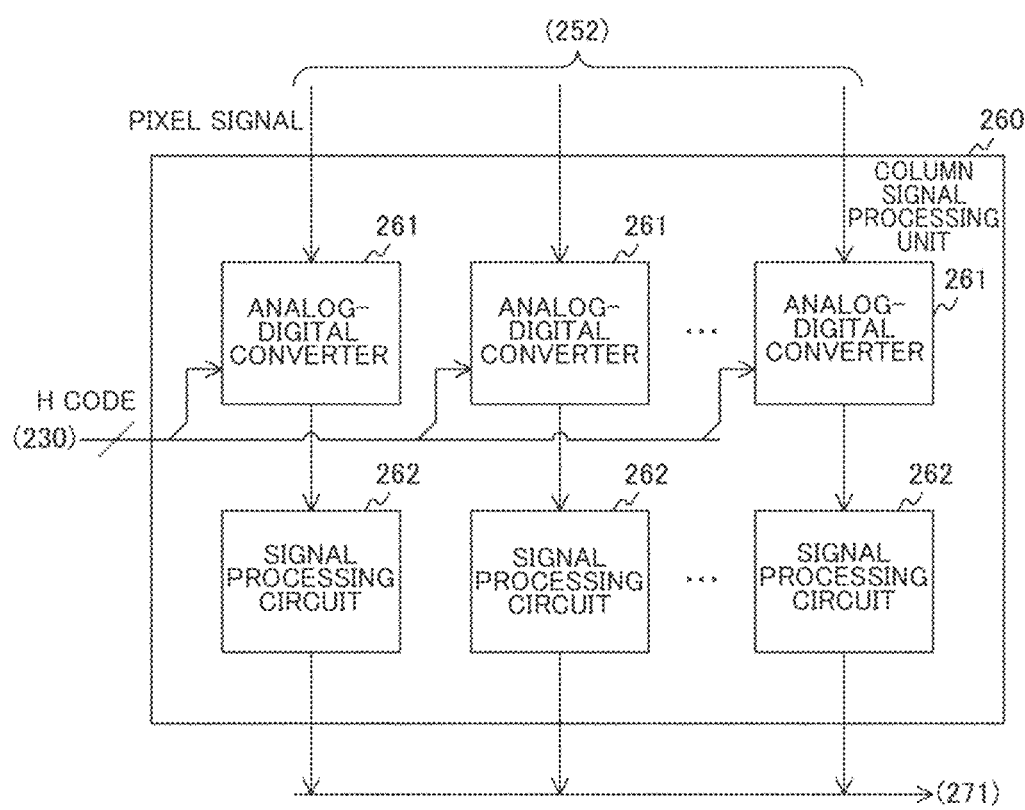
FIG. 7 is a block diagram illustrating an exemplary configuration of a column signal processing unit according to the first embodiment of the present technology.

FIG. 7 is a block diagram illustrating an exemplary configuration of the column signal processing unit 260 according to the first embodiment of the present technology. The column signal processing unit 260 includes a plurality of analog-digital converters 261 and a plurality of signal processing circuits 262.

The analog-digital converter 261 and the signal processing circuit 262 are disposed for each column of pixels. For example, when the number of columns in the pixel array unit 252 is k (where k is an integer), k analog-digital converters 261 and k signal processing circuits 262 are provided.

The analog-digital converter 261 performs AD conversion on a pixel signal of a corresponding column in accordance with the H code. The analog-digital converter 261 may be a single slope type analog-to-digital converter (ADC) or a successive approximation register (SAR) ADC. A delta sigma type or double integration type ADC may be used.

Here, the H code generation unit 230 supplies the bits in the H code to the analog-digital converter 261 in a corresponding column. When pixels of 8 rows×8 columns are arrayed in each area, the H code generation unit 230 generates an 8-bit H code for each area eight times for each. The H code generation unit 230 inputs the bits of the column corresponding to the H code to each of the eight analog-digital converters 261 corresponding to the access target area.

When an input bit is "1", the analog-digital converter 261 performs AD conversion. When the input bit is "0", the analog-digital converter 261 does not perform AD conversion. That is, the analog-digital converter 261 is set to be enabled or disabled in accordance with the bits of the H code. The enabled analog-digital converter 261 supplies data subjected to the AD conversion as pixel data to the corresponding signal processing circuit 262.

The signal processing circuit 262 performs various kinds of signal processing such as CDS processing on the pixel data. The signal processing circuit 262 supplies the pixel data subjected to the signal processing to the image processing unit 271.

The ADC is provided for each column, but the ADC may be disposed for each pixel or each area. A region where the ADC is provided is not always the same as an area to which the access code is applied. When the ADC is provided for each pixel or each area, for example, a circuit disclosed in WO 2016/136448 (Specification) is applied.

Figure 8:
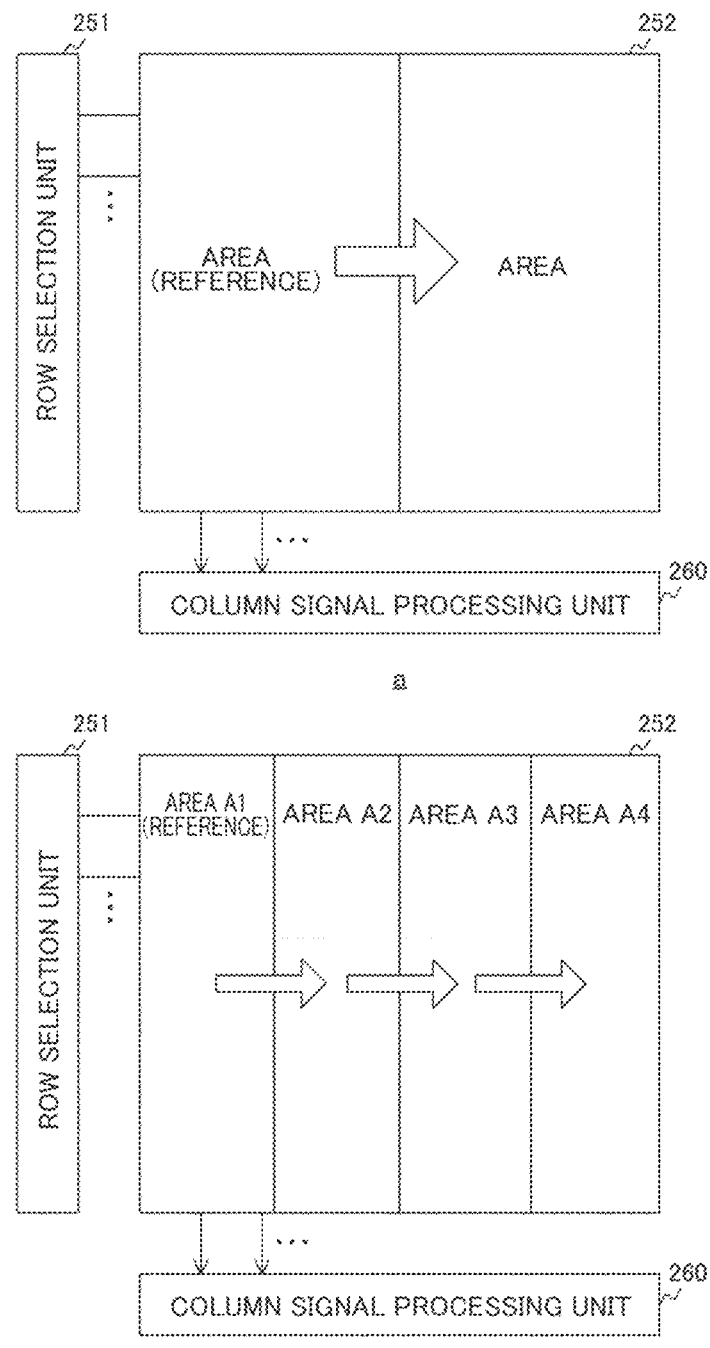
FIG. 8 is a diagram illustrating a method of generating an access code of areas arrayed in the horizontal direction according to the first embodiment of the present technology.

FIG. 8 is a diagram illustrating a method of generating an access code of areas arrayed in the horizontal direction according to the first embodiment of the present technology. In the drawing, a is a diagram illustrating a method of generating access codes when the pixel array unit 252 is divided into two areas.

In the drawing, b is a diagram illustrating a method of generating access codes when the pixel array unit 252 is divided into four areas.

As exemplified in a of the drawing, when the pixel array unit 252 is divided into two areas along a boundary line in the column direction, the reference access code is generated in, for example, the left area between the divided two areas.

Through the calculation of the reference access code, the non-reference access code is generated in the right area.

As exemplified in b of the drawing, a case in which the pixel array unit 252 is divided into four areas along boundary lines in the column direction will be considered. The areas are set as A1, A2, A3, and A4 in order from the left. In this case, for example, the reference access code is generated in the area A1. The non-reference access code of the area A2 is generated through the calculation of the reference access code. Subsequently, a non-reference access code of the area A3 is generated through calculation of the non-reference access code of the area A2. A non-reference access code of the area A4 is generated through calculation of the non-reference access code of the area A3.

As exemplified in a and b of the drawing, access codes are generated in all the areas and pixel data of the access destinations are read from each area in accordance with each access code. The number of pairs of area (A1 or the like) where the access code is referred to and area (A2 or the like) where an access code is newly calculated from the access code may be singular or plural.

Here, a comparative example in which the application processor 120 generates an access code with regard to or all the pixels and the solid-state image sensor 200 retains the code is assumed. In the comparative example, it is necessary for the solid-state image sensor 200 to retain the access code with the same number of bits as the number of all pixels.

Thus, when the access code (that is, the reference access code) of the other areas are generated from the access code (that is, the non-reference access code) of the specific area, the solid-state image sensor 200 may retain only the reference access code. Therefore, compared to the comparative example, it is possible to reduce a data amount of the access code. For example, as in a of the drawing, when the access code of the other area is generated from the access code of one of the two areas, the data amount of the access code is ½ of that of the comparative example. Because of a reduce in the data amount of the access code, it is possible to reduce a memory capacity necessary to retain the code and a communication amount of an interface transmitting the code.

Figure 9:
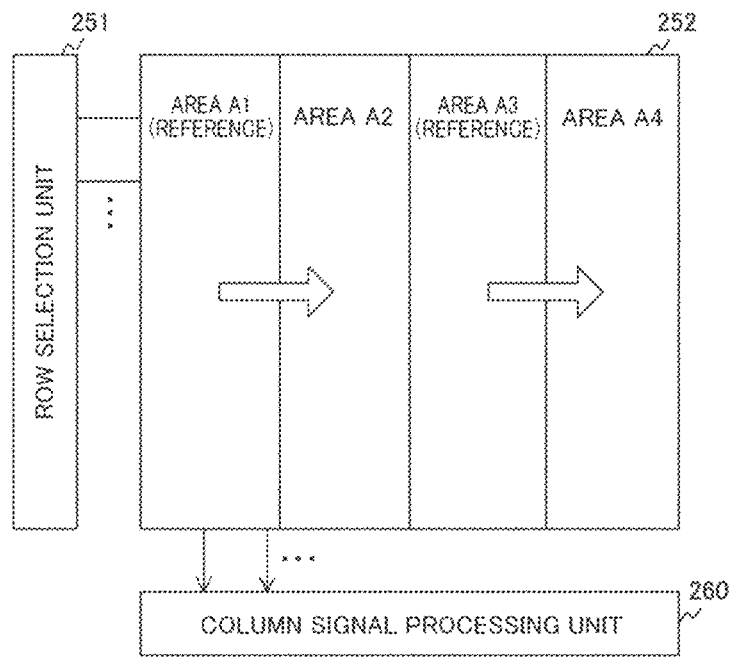
FIG. 9 is a diagram illustrating another example of the method of generating the access code of the areas arrayed in the horizontal direction according to the first embodiment of the present technology.
Figure 9:
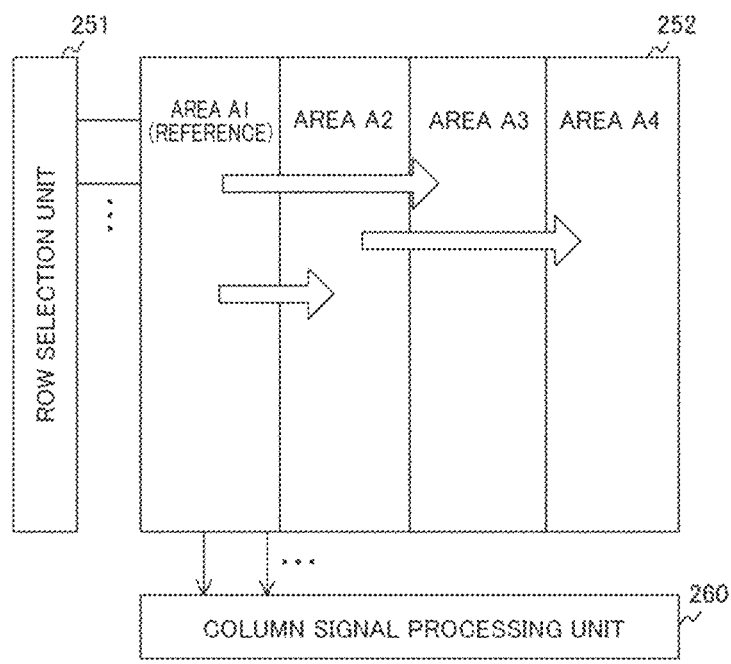

FIG. 9 is a diagram illustrating another example of the method of generating the access code of the areas arrayed in the horizontal direction according to the first embodiment of the present technology. In the drawing, a is a diagram illustrating a method of generating the access code when the number of reference areas is two. In the drawing, b is a diagram illustrating a method of generating the access code when the number of reference areas is one.

As exemplified in a of the drawing, a case in which the pixel array unit 252 is divided into areas A1, A2, A3, and A4 along boundary lines in the column direction will be considered. In this case, for example, the reference access codes are generated in the areas A1 and A3. Two reference access codes may be the same or may be different. The non-reference access code of the area A2 is generated through calculation of the reference access code of the area A1. The non-reference access code of the area A4 is generated through calculation of the reference access code of the area A.

Alternatively as exemplified in b of the drawing, the reference access code is generated in only the area A1. The non-reference access codes of the areas A2 and A3 are generated through calculation of the reference access code. Then, the non-reference access code of the area A4 is generated through calculation of the non-reference access code of the area A2.

As exemplified in a and b of the drawing, the number of reference areas may be one or may be two or more. An area where the access code is referred to and an area where the access code is newly calculated from the access code may be adjacent to each other or may be away from each other. The access code of each of two or more areas (the areas A2 and A3 or the like) can also be calculated from one access code (the access code of the area A1 or the like).

Figure 10:
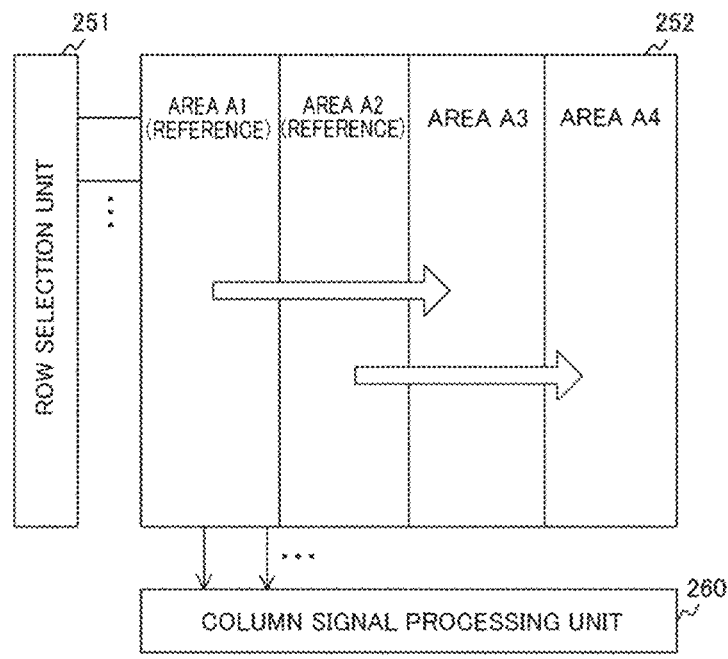
FIG. 10 is a diagram illustrating still another example of the method of generating the access code of the areas arrayed in the horizontal direction according to the first embodiment of the present technology.
Figure 10:
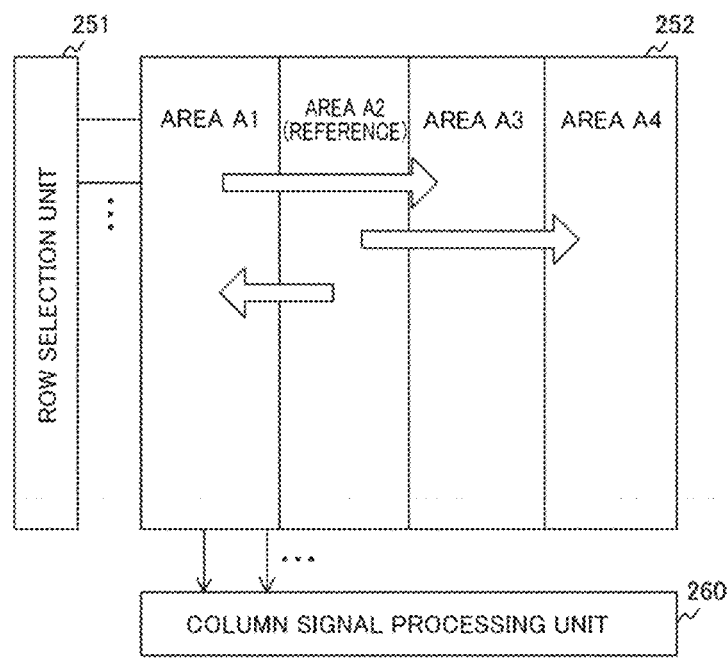

FIG. 10 is a diagram illustrating still another example of the method of generating the access code of the areas arrayed in the horizontal direction according to the first embodiment of the present technology.

As exemplified in a of the drawing, a case in which the pixel array unit 252 is divided into the areas A1, A2, A3, and A4 along boundary lines in the column direction will be considered. In this case, for example, the reference access codes are generated in the areas A1 and A2. The non-reference access code of the area A3 is generated through calculation of the reference access code of the area A1. The non-reference access code of the area A4 is generated through calculation of the reference access code of the area A2.

Alternatively as exemplified in b of the drawing, the reference access code is generated in only the area A2. The non-reference access codes of the areas A1 and A4 are generated through calculation of the reference access code of the area A2. The non-reference access code of the area A3 is generated through calculation of the non-reference access code of the area A1.

As exemplified in a and b of the drawing, the area where the access code is generated through the calculation may be an area (A1 or the like) to the left of an area (A2 or the like) of a reference source or may be an area (A4 or the like) to the right.

Figure 11:
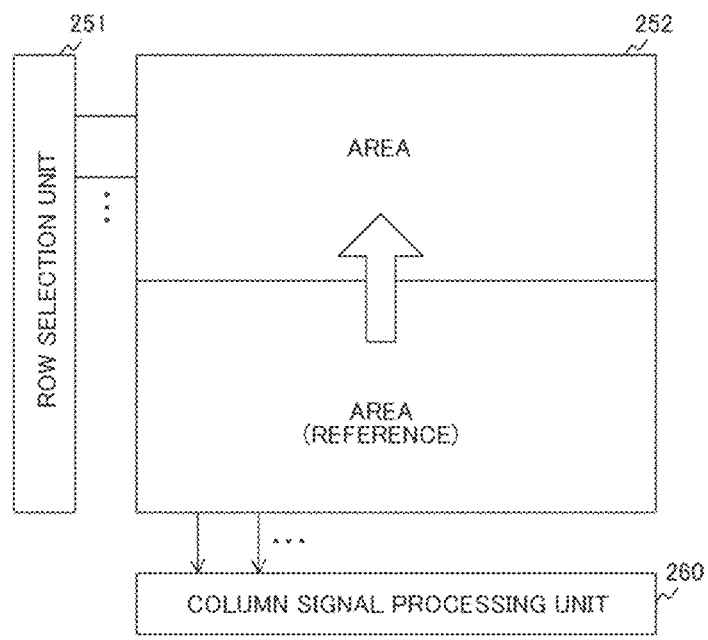
FIG. 11 is a diagram illustrating a method of generating an access code of areas arrayed in the vertical direction according to the first embodiment of the present technology.
Figure 11:
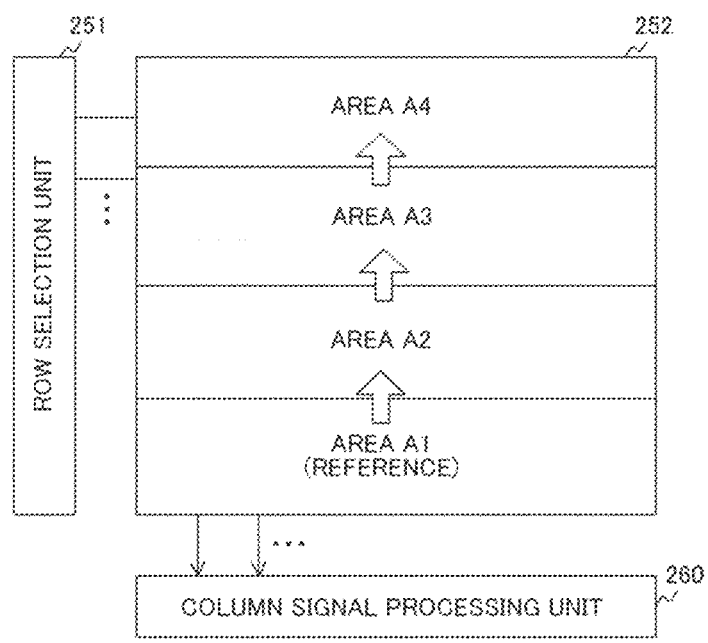

FIG. 11 is a diagram illustrating a method of generating an access code of areas arrayed in the vertical direction according to the first embodiment of the present technology. In the drawing, a is a diagram illustrating a method of generating the access code when the pixel array unit is divided into two areas. In the drawing, b is a diagram illustrating a method of generating the access code when the pixel array unit is divided into four areas.

As exemplified in a of the drawing, when the pixel array unit 252 is divided into two areas along boundary lines in a row direction, the reference access code is generated in, for example, the area on the lower side between the areas. The non-reference access code of the area on the upper side is generated through calculation of the reference access code.

As exemplified in b of the drawing, a case in which the pixel array unit 252 is divided into four areas along boundary lines in the row direction will be considered. The areas are referred to as A1, A2, A3, and A4 in order from the lower side. In this case, for example, the reference access code is generated in the area A1, The non-reference access code of the area A2 is generated through calculation of the reference access code. Then, the non-reference access code of the area A3 is generated through calculation of the non-reference access code of the area A2. The non-reference access code of the area A4 is generated through calculation of the non-reference access code of the area A3.

Figure 12:
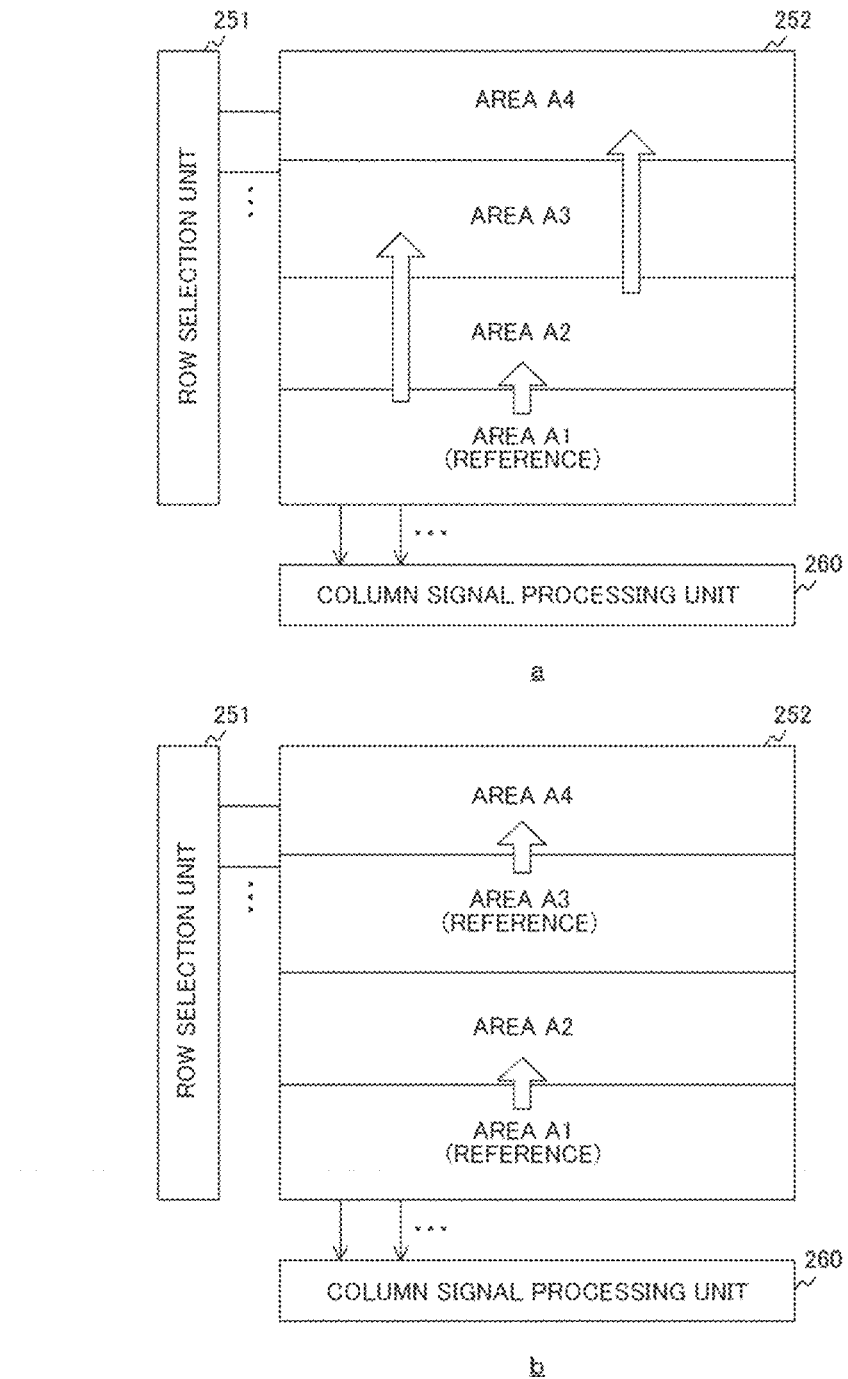
FIG. 12 is a diagram illustrating another example of the method of generating the access code of the areas arrayed in the vertical direction according to the first embodiment of the present technology.

FIG. 12 is a diagram illustrating another example of the method of generating the access code of the areas arrayed in the vertical direction according to the first embodiment of the present technology. In the drawing, a is a diagram illustrating a method of generating the access code when the number of reference areas is one. In the drawing, b is a diagram illustrating a method of generating the access code when the number of reference areas is two.

As exemplified in a of the drawing, a case in which the pixel array unit 252 is divided into areas A1, A2, A3, and A4 along boundary lines in the row direction will be considered. In this case, for example, the reference access code is generated in only the area A1. The non-reference access code of each of the areas A2 and A3 is generated through calculation of the reference access code. The non-reference access code of the area A4 is generated through calculation of the non-reference access code of the area A2.

Alternatively, as exemplified in b of the drawing, the reference access codes are generated in the areas A1 and A3. The non-reference access code of the area A2 is generated through calculation of the reference access code of the area A1. The non-reference access code of the area A4 is generated through calculation of the reference access code of the area A3.

Figure 13:
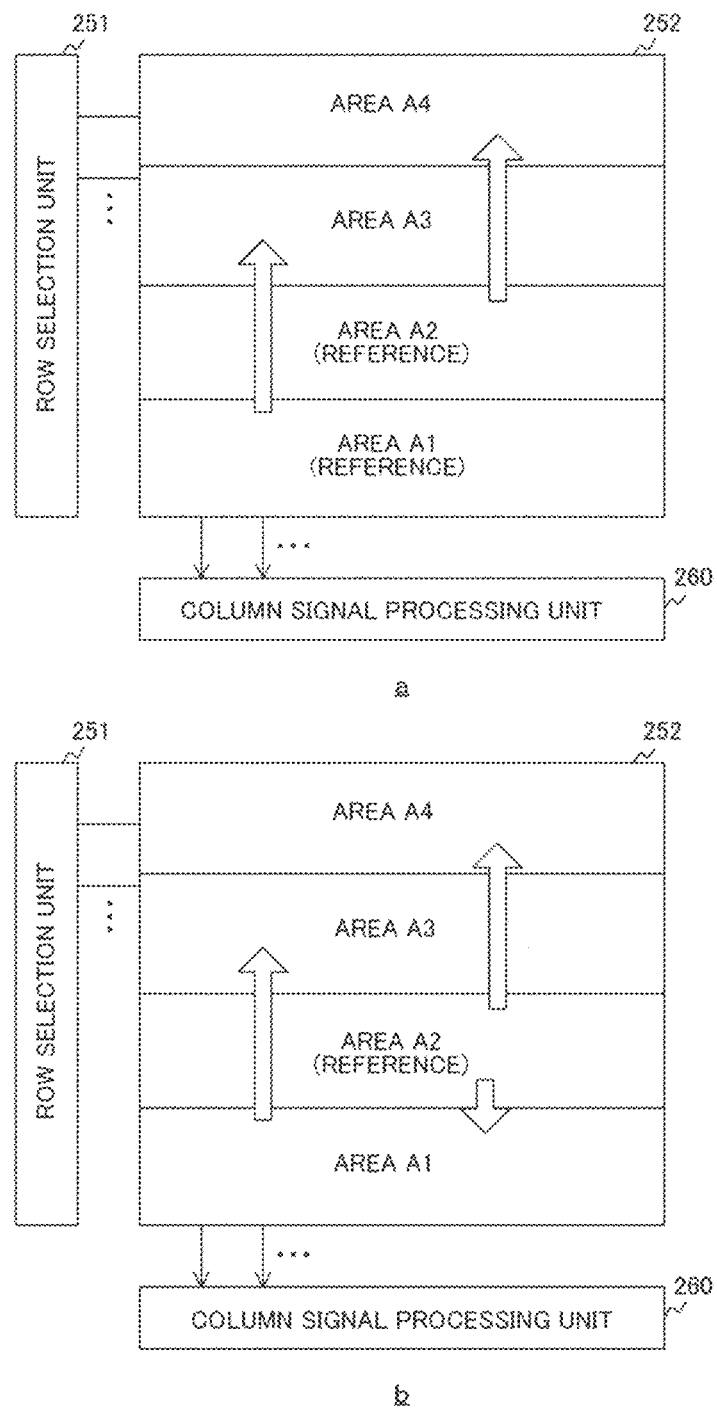
FIG. 13 is a diagram illustrating still another example of the method of generating the access code of the areas arrayed in the vertical direction according to the first embodiment of the present technology.

FIG. 13 is a diagram illustrating still another example of the method of generating the access code of the areas arrayed in the vertical direction according to the first embodiment of the present technology. In the drawing, a is a diagram illustrating a method of generating the access code when the number of reference areas is two. In the drawing, b is a diagram illustrating a method of generating the access code when the number of reference areas is one.

As exemplified in a of the drawing, a case in which the pixel array unit 252 is divided into areas A1, A2, A3, and A4 along boundary lines in the row direction will be considered. In this case, for example, the reference access code is generated in the areas A1 and A2. The non-reference access code of the area A3 is generated through calculation of the reference access code of the area A1. The non-reference access code of the area A4 is generated through calculation of the reference access code of the area A2.

Alternatively as exemplified in b of the drawing, the reference access code is generated in only the area A2. The non-reference access codes of the areas A1 and A4 are generated through calculation of the reference access code of the area A2. The non-reference access code of the area A3 is generated through calculation of the non-reference access code of the area A1.

As exemplified in FIGS. 8 to 13, the areas may be arrayed in the row direction or may be arrayed in the column direction.

Figure 14:
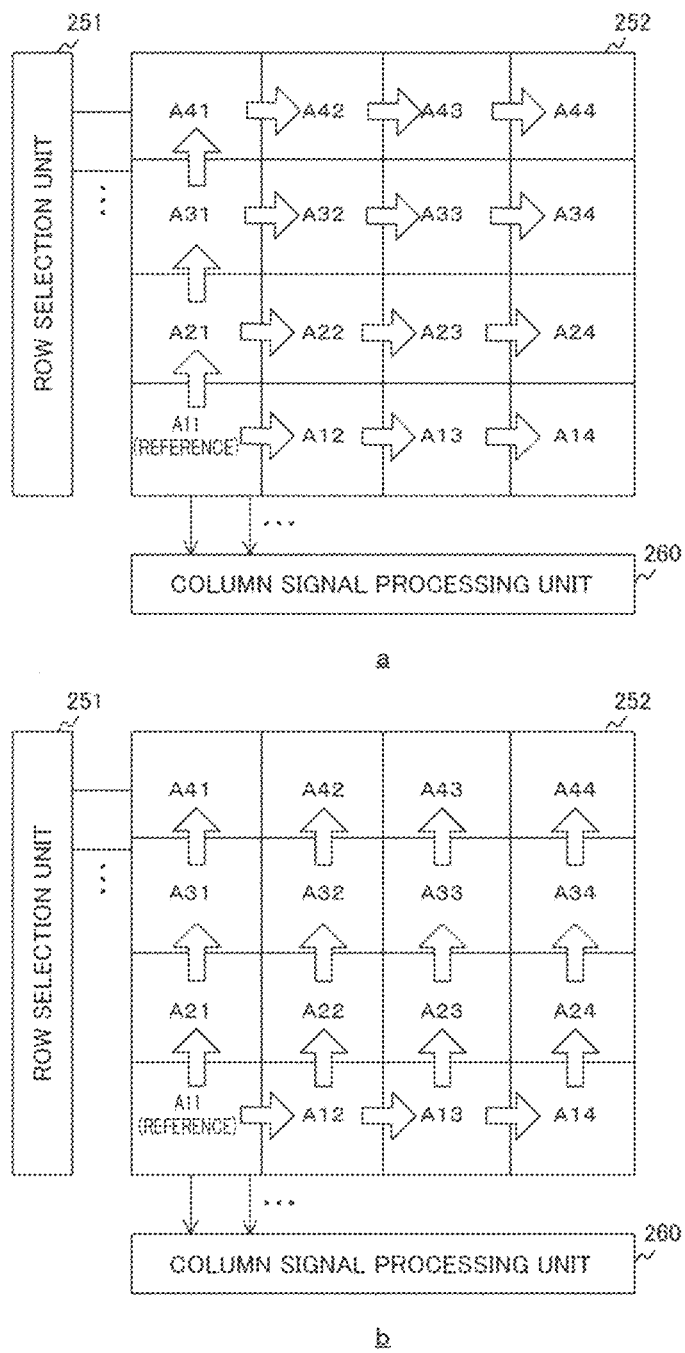
FIG. 14 is a diagram illustrating a method of generating access codes of areas arrayed in a 2-dimensional lattice form according to the first embodiment of the present technology.

FIG. 14 is a diagram illustrating a method of generating access codes of areas arrayed in a 2-dimensional lattice form according to the first embodiment of the present technology. In the drawing, a is a diagram illustrating a method of generating the access codes one row by one row in order. In the drawing, b is a diagram illustrating a method of generating the access codes one column by one column in order.

A case in which the pixel array unit is divided into areas of 4 rows×4 columns along boundary lines in the row and column directions will be considered. Aij denotes an area in an i (where i is an integer of 1 to 4) row and a j (where j is an integer of 1 to 4) column.

As exemplified in a of the drawing, the reference access code is generated in the area A11, for example. The non-reference access codes of an area A12 is generated through calculation of the reference access code of an area A11. The non-reference access code of an area A13 is generated through calculation of the non-reference access code of an area A12. Subsequently, the non-reference access code of the area A14 is generated through calculation of the non-reference access code of the area A13.

Then, the non-reference access code of an area A21 is generated through calculation of the reference access code of the area A11. Hereinafter, the access code of the area in the second row is generated in a procedure similar to the first row. Then, in a procedure similar to the second row, the access code of the area in the third row is generated and the access code of the area in the fourth row is generated.

Alternatively as exemplified in b of the drawing, in the first column, the non-reference access code of the area A21 is generated through calculation of the reference access code of the area A11. The non-reference access codes of an area A31 is generated through calculation of the non-reference access code of an area A21. The non-reference access code of an area A41 is generated through calculation of the non-reference access code of the area A31.

In the second column, the non-reference access codes of the area A12 is generated through calculation of the reference access code. The non-reference access code of an area A22 is generated through calculation of the non-reference access code of the area A12. The non-reference access codes of an area A32 is generated through calculation of the non-reference access code of the area A22. The non-reference access code of an area A42 is generated through calculation of the non-reference access code of the area A32. Later, the access codes in the third column are generated, and then the access codes in the fourth column are generated in a procedure similar to that of the second column.

As exemplified in a and b of the drawing, the areas may be arrayed in a 2-dimensional lattice form and the solid-state image sensor 200 may generate the access codes one row by one row in order or may generate the access codes one column by one column in order.

Figure 15:
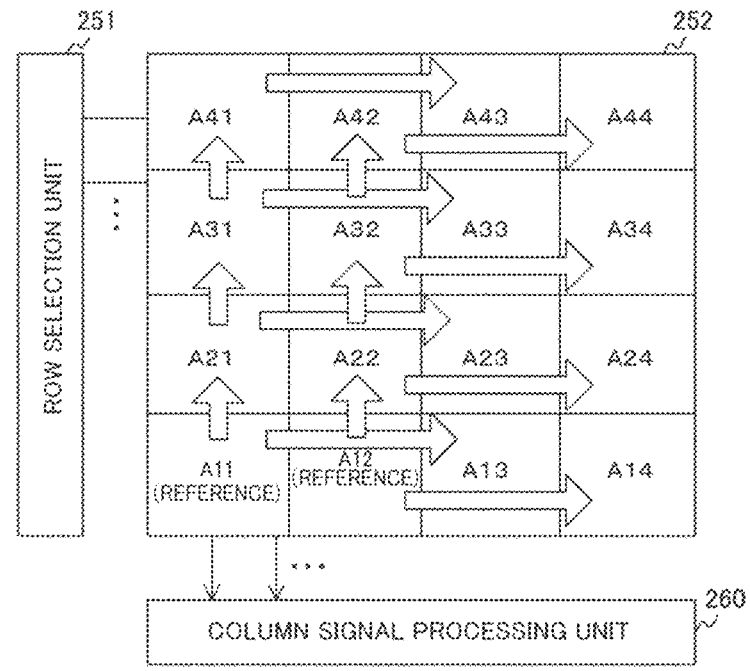
FIG. 15 is a diagram illustrating another example of the method of generating the access code of the areas arrayed in the 2-dimensional lattice form according to the first embodiment of the present technology.
Figure 15:
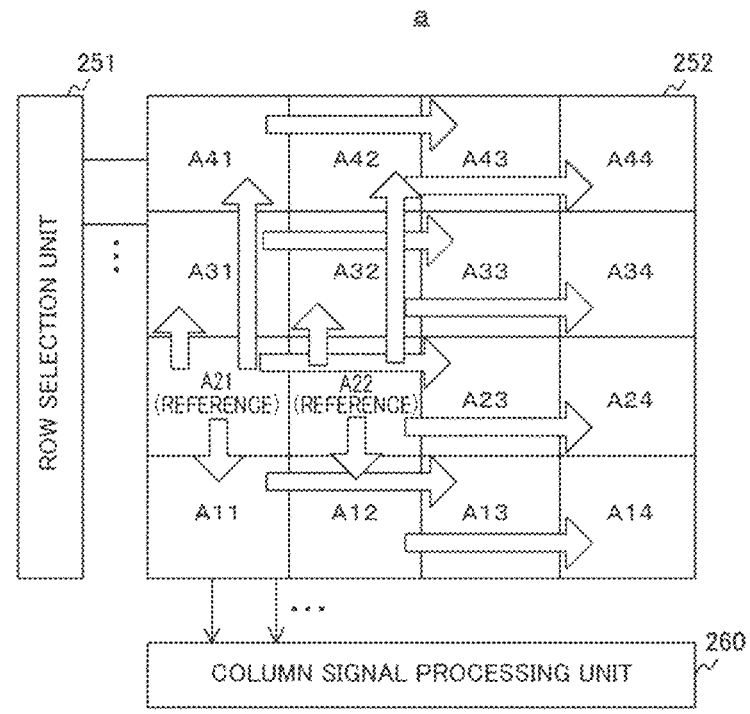

FIG. 15 is a diagram illustrating another example of the method of generating the access code of the areas arrayed in the 2-dimensional lattice form according to the first embodiment of the present technology. In the drawing, a is a diagram illustrating a method of generating the access codes in order from the lower side.

In the drawing, b is a diagram illustrating a method of generating two or more access codes from one access code.

As exemplified in a of the drawing, for example, the reference access codes are generated in the areas A11 and A12. In the first row, the non-reference access codes of the area A13 is generated through calculation of the reference access code of the area A11. The non-reference access code of the area A14 is generated through calculation of the reference access code of the area A12.

In the second row, the non-reference access codes of the area A21 is generated through calculation of the reference access code of the area A11. The non-reference access code of the area A22 is generated through calculation of the reference access code of the area A12. Then, the non-reference access codes of an area A23 is generated through calculation of the non-reference access code of the area A21. The non-reference access code of an area A24 is generated through calculation of the non-reference access code of the area A22. Later, the access codes in the third and fourth columns are generated in a procedure similar to that of the second column.

As exemplified in b of the drawing, for example, the reference access codes are generated in the areas A21 and A22. The non-reference access codes of the areas A11, A31, and A41 are generated through calculation of the reference access code of the area A21. The non-reference access codes of the areas A12, A32, and A42 are generated through calculation of the reference access code of the area A22.

Then, the non-reference access code of the area A23 is generated through calculation of the reference access code of the area A21 in the second row. The non-reference access code of the area A24 is generated through calculation of the reference access code of the area A22. Later, the access codes of the area in the first, third, and fourth columns are generated in a procedure similar to that of the second column.

Figure 16:
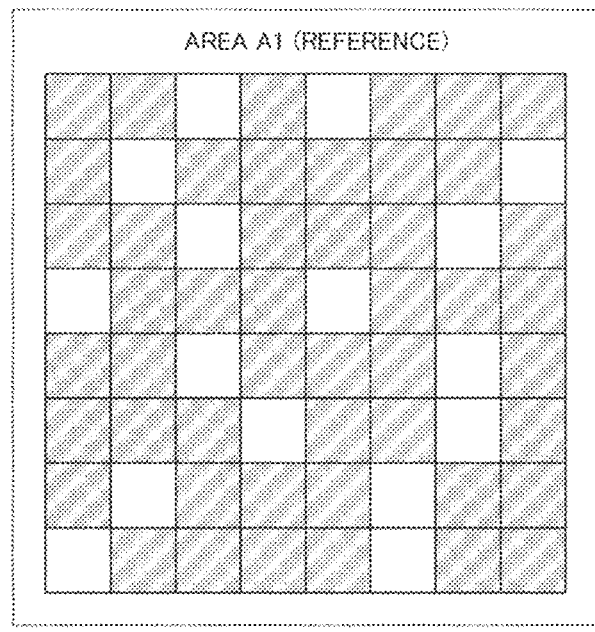
FIG. 16 is a diagram illustrating a method of generating an access code through inversion according to the first embodiment of the present technology.
Figure 16:
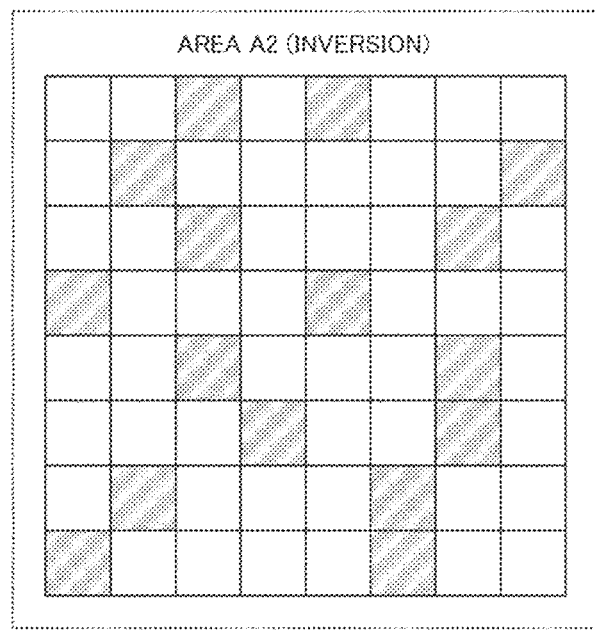

As exemplified in a and b of the drawing, an area where the access code is generated through calculation may be an area (A31 or the like) above or an area (A11 or the like) below the area (A21 or the like) of a reference source, FIG. 16 is a diagram illustrating a method of generating an access code through inversion according to the first embodiment of the present technology. In the drawing, a is a diagram illustrating an example of pixels of access destinations of the area A1 to which the reference access code is applied. In the drawing, b is a diagram illustrating an example of pixels of the access destinations of the area A2 to which an access code obtained through bit-by-bit inversion of the reference access code is applied. In a and b of the drawing, shaded portions indicate pixels which are not access destinations and white portions indicate pixels of access destinations.

As exemplified in a of the drawing, for example, first and sixth columns from the left in a first row from the bottom of the area A1 are designated as the access destinations in accordance with the reference access code.

The non-reference access code generation unit 220 in the solid-state image sensor 200 performs calculation for inverting the reference access code bit by bit and obtains a calculation result as the non-reference access code of the area A2.

As exemplified in b of the drawing, in the area A2, the pixels of the access destinations of the area A1 are not accessed and the pixels which have not been accessed are accessed in accordance with the non-reference access code. For example, the pixels from the bottom to the first row of the area A2 other than the first and sixth pixels from the left are designated as access destinations.

Figure 17:
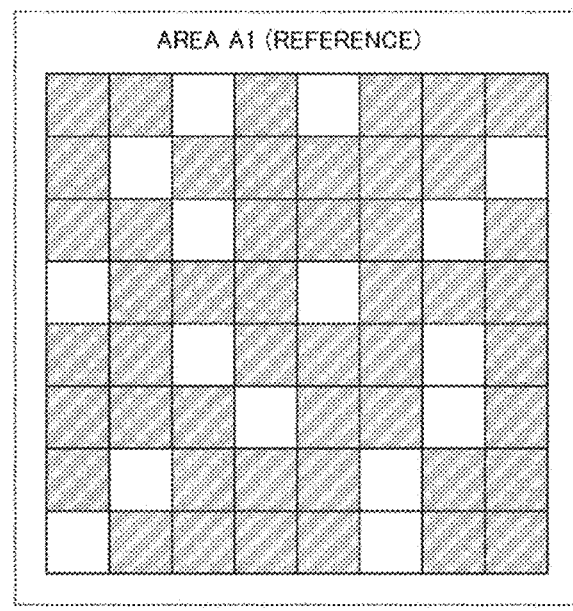
FIG. 17 is a diagram illustrating a method of generating an access code through bit-order inversion in the row direction according to the first embodiment of the present technology.
Figure 17:
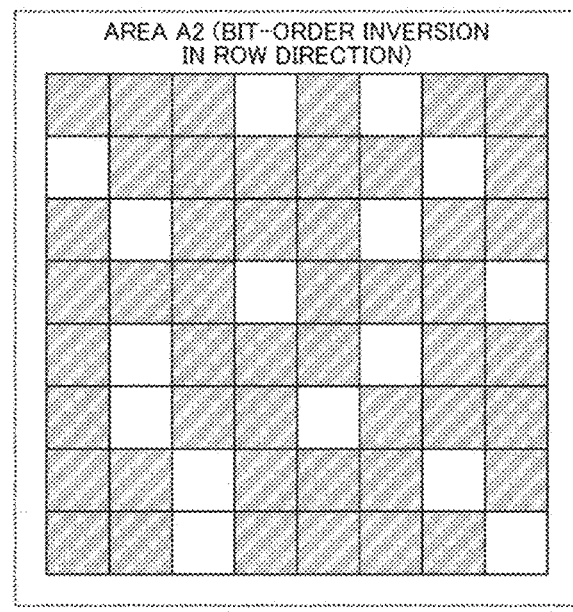

FIG. 17 is a diagram illustrating a method of generating an access code through bit-order inversion in the row direction according to the first embodiment of the present technology. In the drawing, a is diagram illustrating an example of pixels of access destinations of the area A1 to which the reference access code is applied. In the drawing, b is a diagram illustrating an example of pixels of access destinations of the area. A2 to which an access code obtained by inverting the reference access code in a bit order in the row direction is applied.

As exemplified in a of the drawing, for example, first to sixth pixels from the left in the first row from the bottom of the area A1 are designated as access destinations in accordance with the reference access code.

The solid-state image sensor 200 performs calculation for converting the bit order of the reference access code in the row direction and obtains a calculation result as the non-reference access code of the area A2.

As exemplified in b of the drawing, the positions of the pixels of the access destinations are inverted to the right and left in the area A2 compared to the area A1 in accordance with the non-reference access code. For example, the pixels in the third and eighth pixels from the left in the first row from the bottom of the area A2 are designated as access destinations.

Figure 18:
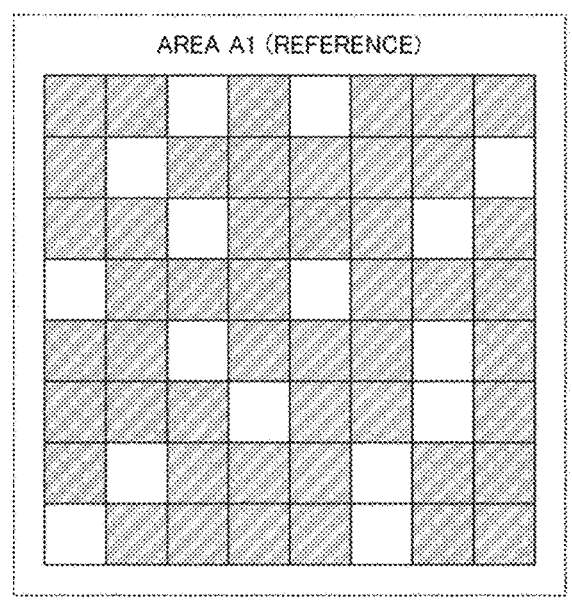
FIG. 18 is a diagram illustrating a method of generating an access code through bit-order inversion in the row and column directions according to the first embodiment of the present technology.
Figure 18:
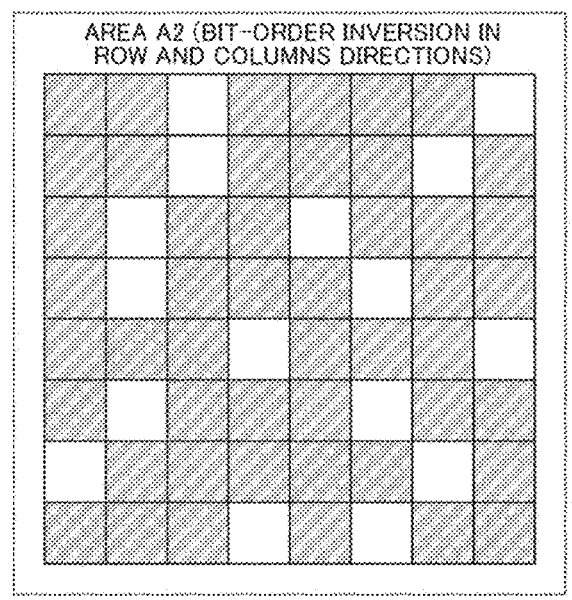

FIG. 18 is a diagram illustrating a method of generating an access code through bit-order inversion in the row and column directions according to the first embodiment of the present technology. In the drawing, a is a diagram illustrating an example of pixels of the access destinations of the area A1 to which the reference access code is applied. In the drawing, b is a diagram illustrating an example of pixels of the access destinations of the area A2 to which the access code of which the bit order in the row and column directions of the reference access code is inverted is applied.

The solid-state image sensor 200 performs calculation for converting the bit order of the reference access code in the row and column directions and obtains a calculation result as the non-reference access code of the area A. As exemplified in b of the drawing, the positions of the pixels of the access destinations are inverted to the right and left in the area A2 compared to the area A1. The solid-state image sensor 200 can also invert the bit order in only the column direction.

Figure 19:
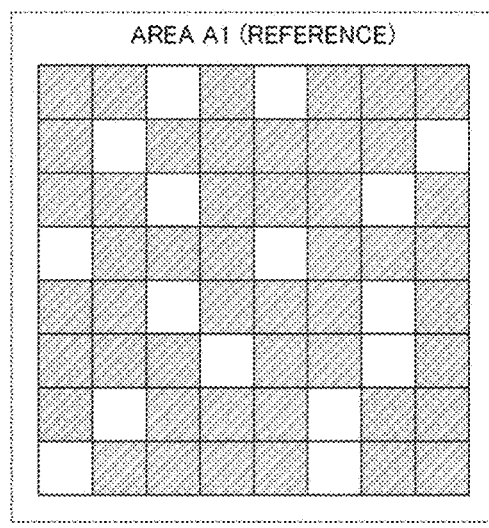
FIG. 19 is a diagram illustrating a method of generating an access code through 1-pixel cyclic shifting according to the first embodiment of the present technology.
Figure 19:
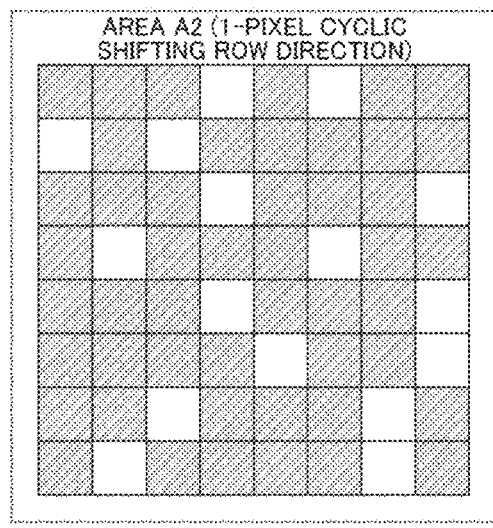

FIG. 19 is a diagram illustrating a method of generating an access code through 1-pixel cyclic shifting according to the first embodiment of the present technology.

In the drawing, a is a diagram illustrating an example of pixels of access destinations of the area A1 to which the reference access code is applied. In the drawing, b is a diagram illustrating an example of pixels of access destinations of the area A2 to which an access code subjected to cyclic shifting in the row direction by one pixel with respect to the reference access code is applied.

As exemplified in a of the drawing, for example, first to sixth pixels from the left in the first row from the bottom of the area A1 are designated as access destinations in accordance with the reference access code.

The solid-state image sensor 200 performs calculation of cyclic shifting in the row direction by one pixel in a bit sequence of each row of the reference access code and obtains a calculation result as the non-reference access code of the area A2. A shifting direction may be a right direction or may be a left direction.

As exemplified in b of the drawing, the positions of the pixels of the access destinations are cyclically shifted by one pixel in the row direction (for example, the right direction) in the area A2 in accordance with the non-reference access code compared to the area A1. For example, the pixels in the second and seventh pixels from the left in the first row from the bottom of the area A2 are designated as access destinations.

Figure 20:
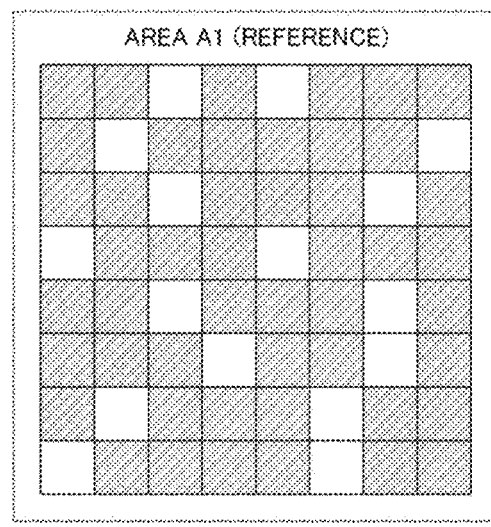
FIG. 20 is a diagram illustrating a method of generating an access code through 2-pixel cyclic shifting according to the first embodiment of the present technology.
Figure 20:
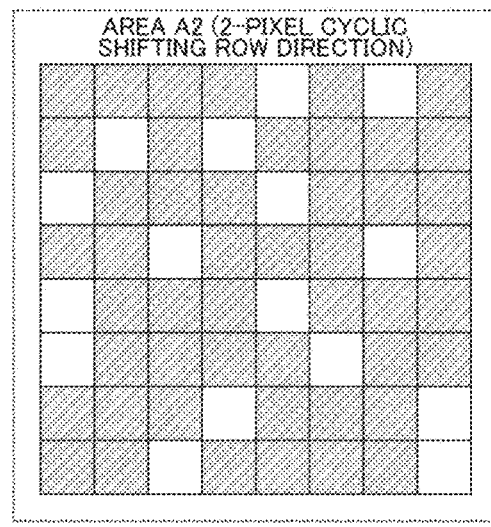

FIG. 20 is a diagram illustrating a method of generating an access code through 2-pixel cyclic shifting according to the first embodiment of the present technology.

In the drawing, a is a diagram illustrating an example of pixels of access destinations of the area A1 to which the reference access code is applied. In the drawing, b is a diagram illustrating an example of pixels of access destinations of the area A2 to which an access code subjected to cyclic shifting in the row direction by two pixels with respect to the reference access code is applied.

As exemplified in b of the drawing, the positions of the pixels of the access destinations are cyclically shifted by two pixels in the row direction (for example, the right direction) in the area A2 in accordance with the non-reference access code compared to the area A1. For example, the pixels in the third and eighth columns from the left in the first row from the bottom of the area A2 are designated as access destinations.

Figure 21:
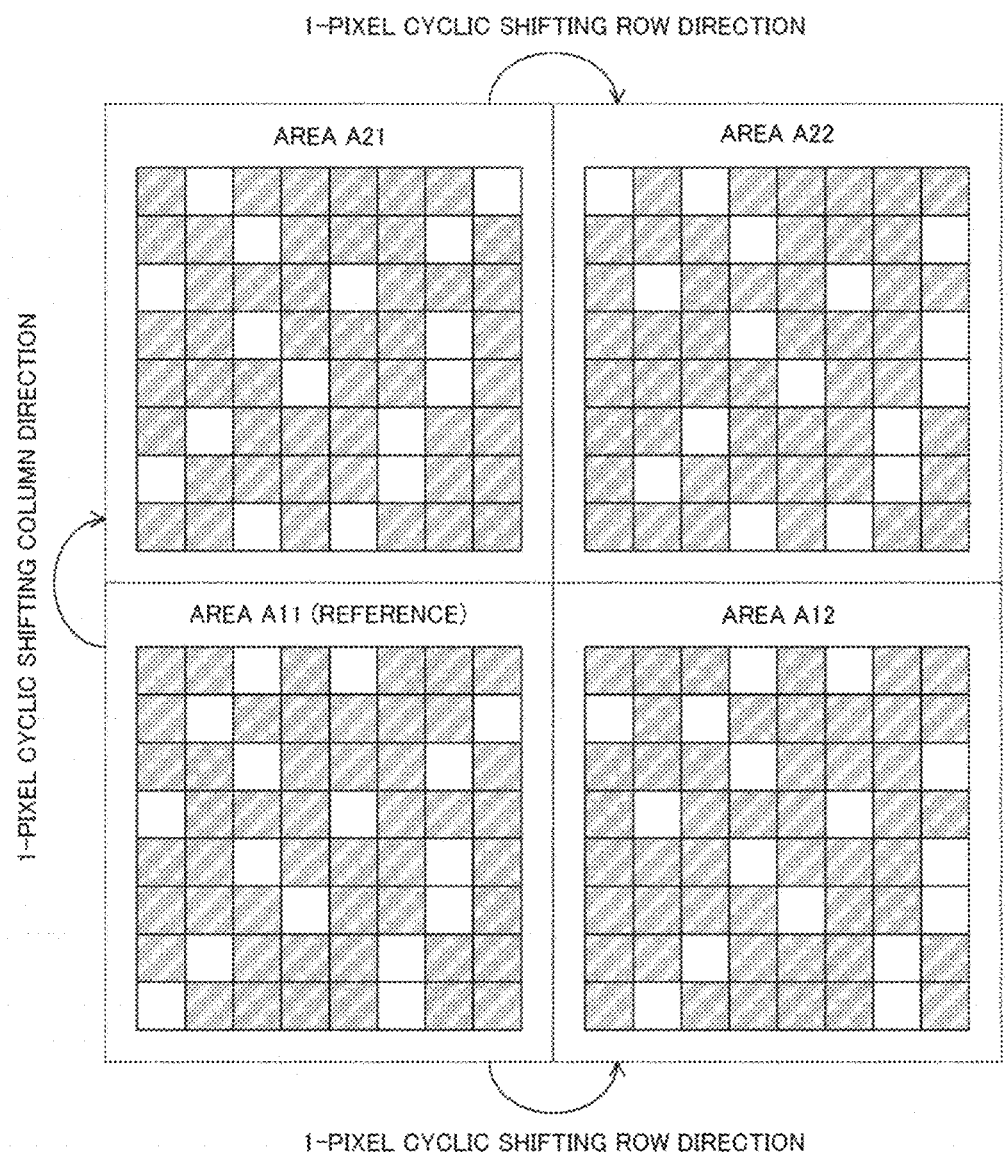
FIG. 21 is a diagram illustrating a method of generating an access code through cyclic shifting in the row and column directions according to the first embodiment of the present technology.

FIG. 21 is a diagram illustrating a method of generating an access code through cyclic shifting in the row and column directions according to the first embodiment of the present technology. As exemplified in the drawing, the reference access code is applied in the area A11.

The solid-state image sensor 200 performs calculation of cyclic shifting in the row direction by one pixel in a bit sequence of each row of the reference access code and obtains a calculation result as the non-reference access code of the area A12.

The solid-state image sensor 200 performs calculation of cyclic shifting in the column direction by one pixel in a bit sequence of each column of the reference access code and obtains a calculation result as the non-reference access code of the area A21. When the shifting is performed in the column direction, the shifting direction may be an upper direction or may be a lower direction.

The solid-state image sensor 200 performs calculation of cyclic shifting in the row direction by one pixel with respect to the non-reference access code of the area A21 and obtains a calculation result as the non-reference access code of the area A22. Later, in the other areas, the access codes are generated through the cyclic shifting in the row direction or the column direction.

Figure 22:
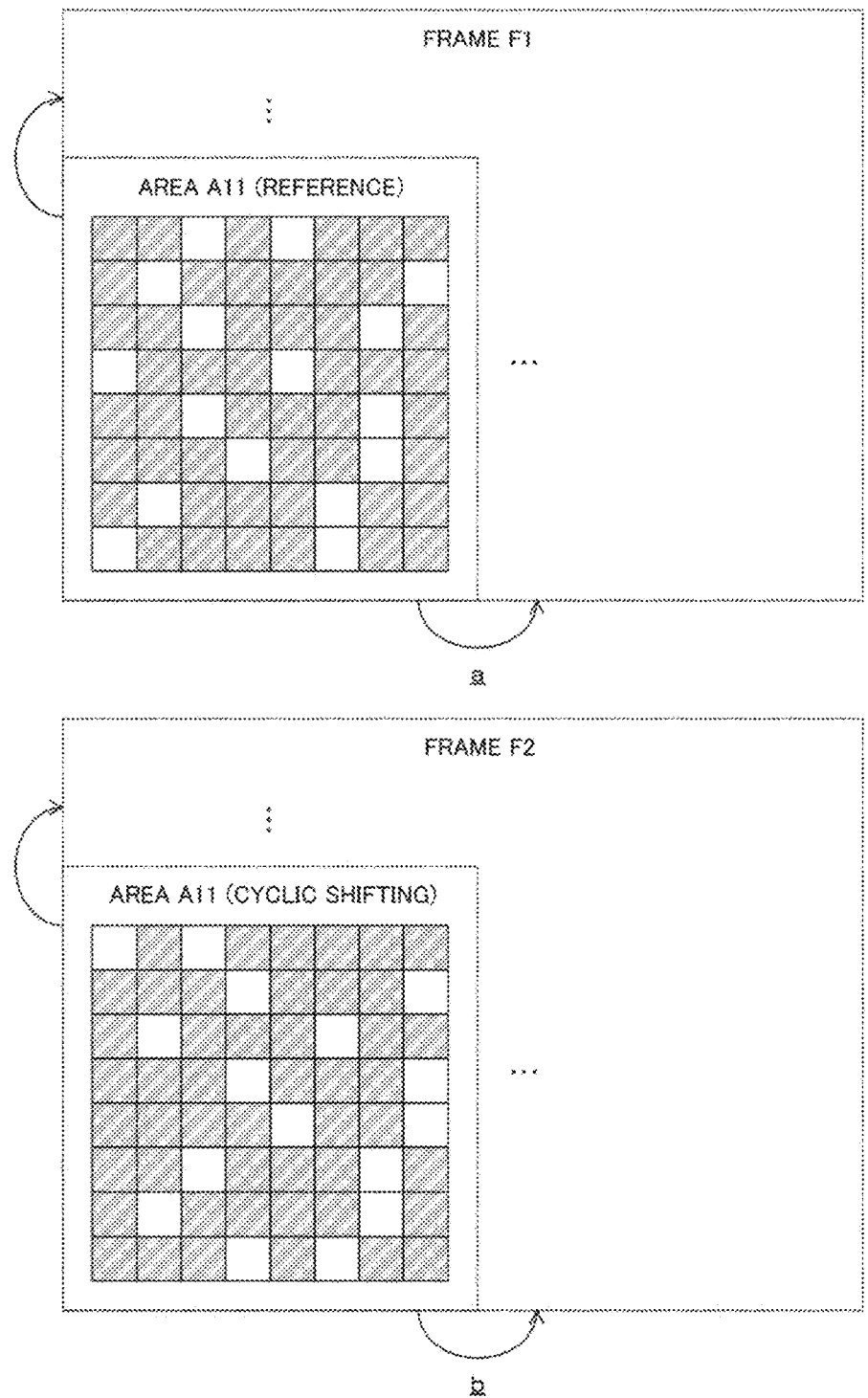
FIG. 22 is a diagram illustrating a method of changing an access code for each piece of image data (frame) according to the first embodiment of the present technology.

FIG. 22 is a diagram illustrating a method of changing an access code for each frame according to the first embodiment of the present technology. In the drawing, a is a diagram illustrating an example of pixels of access destinations of the area A11 to which the reference access code of a frame F1 is applied. In the drawing, b is a diagram illustrating an example of pixels of access destinations of the area A11 to which an access code obtained by performing the calculation on the reference access code is applied in a frame F2.

As exemplified in a of the drawing, the reference access code is applied to the area A11 in the first frame F1. In the other areas, the access code is generated through calculation (cyclic shifting or the like) on the access code of adjacent areas.

The solid-state image sensor 200 performs calculation (cyclic shifting) on the reference access code in a subsequent frame F2 and obtains a calculation result as the access code of the area A11. Then, the solid-state image sensor 200 generates an access code through calculation (cyclic shifting or the like) on the access code of adjacent areas in the areas other than the area A11. Later, access codes after three frames are generated through the calculation similar to that of the frame F2. Through this process, the access code is changed for each frame.

Figure 23:
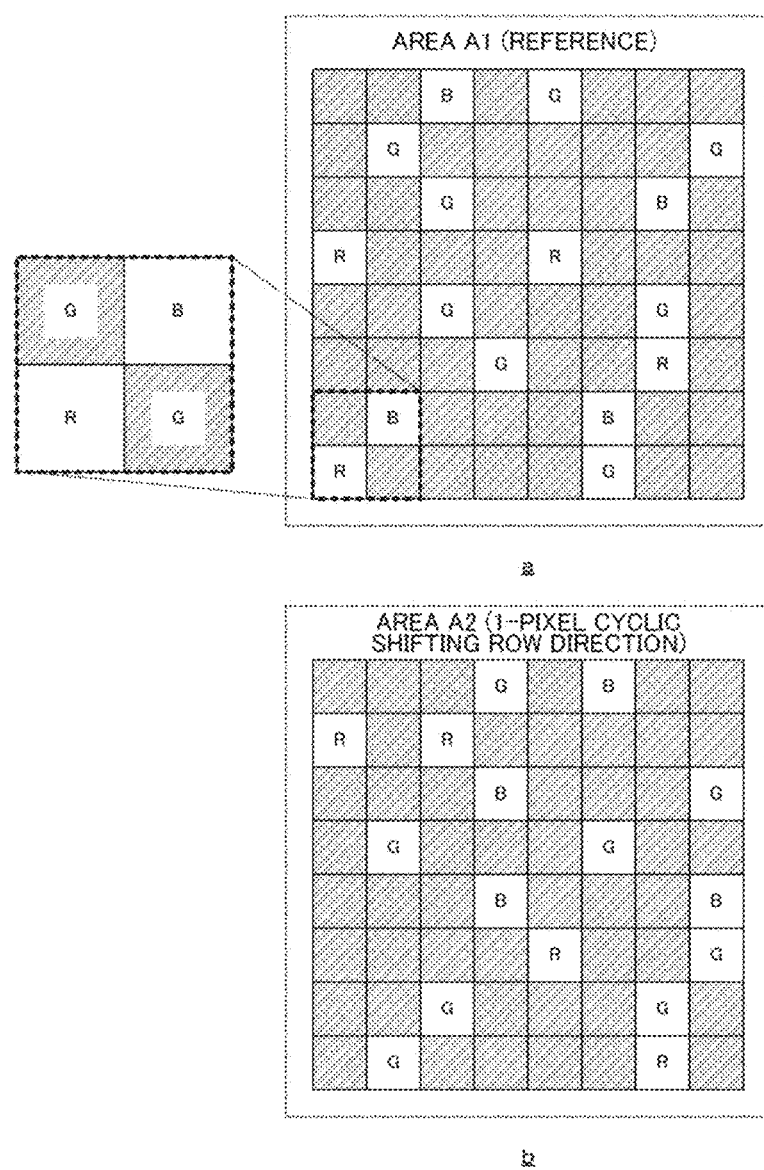
FIG. 23 is a diagram illustrating a method of generating an access code through 1-pixel cyclic shifting in a Bayer array according to the first embodiment of the present technology.

FIG. 23 is a diagram illustrating a method of generating an access code through 1-pixel cyclic shifting in a Bayer array according to the first embodiment of the present technology. In the drawing, a is a diagram illustrating an example of pixels of access destinations of the area A1 to which the reference access code in applied in a Bayer array. In the drawing, b is a diagram illustrating an example of pixels of access destinations of the area A2 to which the access code subjected to the cyclic shifting in the row direction by one pixel with respect to the reference access code is applied.

In the drawing, "R", "G", and "B" are pixels receiving incident light via color filters of red, green, and blue. Notation of R, G, and B of the pixels other than the access destinations is omitted for facilitating description. As exemplified in the drawing, R, G, and B pixels are arrayed in a Bayer array in the pixel array unit 252.

As exemplified in a of the drawing, for example, the R pixel in the first column and the G pixel in the sixth column from the left in the first row from the bottom of the area A1 are designated as access destinations in accordance, with the reference access code.

The solid-state image sensor 200 performs calculation of cyclic shifting in the row direction by one pixel in a bit sequence of each row of the reference access code and obtains a calculation result as the non-reference access code of the area A2.

As exemplified in b of the drawing, the positions of the pixels of the access destinations are cyclically shifted by one pixel in the row direction (the right direction or the like) in the area A2 in accordance with the non-reference access code compared to the area A1. For example, the second G pixel and the seventh R pixel from the left in the first row from the bottom of the area A2 are designated as access destinations.

Figure 24:
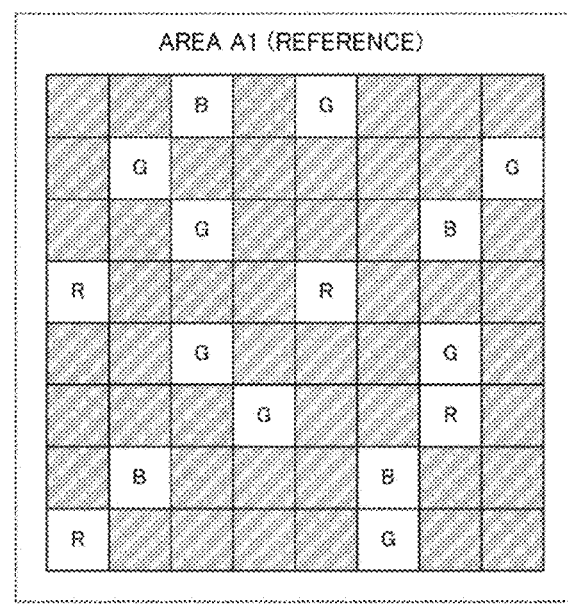
FIG. 24 is a diagram illustrating a method of generating an access code through 2-pixel cyclic shifting in a Bayer array according to the first embodiment of the present technology.
Figure 24:
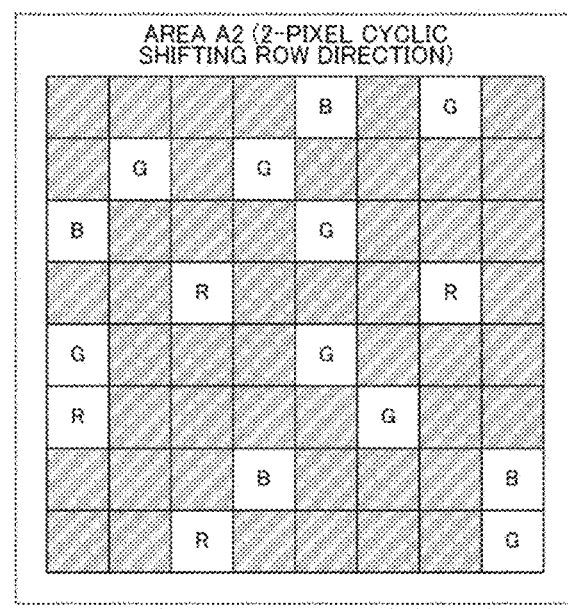

FIG. 24 is a diagram illustrating a method of generating an access code through 2-pixel cyclic shifting in a Bayer array according to the first embodiment of the present technology. In the drawing, a is a diagram illustrating an example of pixels of access destinations of the area A1 to which the reference access code in applied in a Bayer array. In the drawing, b is a diagram illustrating an example of pixels of access destinations of the area A2 to which the access code subjected to the cyclic shifting in the row direction (the right direction or the like) by two pixels with respect to the reference access code is applied.

As exemplified in b of the drawing, for example, the third R pixel and the eighth G pixel from the left in the first row from the bottom of the area A2 are designated as access destinations when the cyclic shifting is performed by two pixels.

In comparison of FIG. 23 to FIG. 24, when the 1-pixel cyclic shifting is performed, the colors of the pixels read in the first row from the bottom are changed compared to the former shifting. However, when the 2-pixel cyclic shifting is performed, the colors of the read pixels are not changed compared to the former shifting. This is because a minimum unit of the Bayer array is 2 rows×2 columns. Accordingly from the viewpoint of improving randomness of color, a shift number of the cyclic shifting is preferably odd in the Bayer array.

As exemplified in FIGS. 16 to 24, the calculation in the generation of the access codes may be bit-by-bit inversion, the bit-order inversion, or the cyclic shifting. Different calculation can also be performed for each area. An inversion direction of the bit order and a shifting direction of the cyclic shifting may be one of the row and column directions or may include both the row and column directions.

Any shift number of the cyclic shifting can be used, but is preferably odd array in particular in the Bayer array. The solid-state image sensor 200 can also change the access code for each frame.

The solid-state image sensor 200 generates the non-reference access code through calculation, but can also generate the non-reference access code without performing calculation. For example, the solid-state image sensor 200 may copy the reference access code as it is and may set the copied reference access code as a non-reference access code or may substitute some bits (2 bits among 8 bits) of a bit sequence with a specific value of "0" or "1" and set the reference access code with the substituted values as a non-reference access code. Areas where calculation is performed and areas in which calculation is not performed can also be mixed.

[Example of Operation of Solid-Sate Image Sensor]

Figure 25:
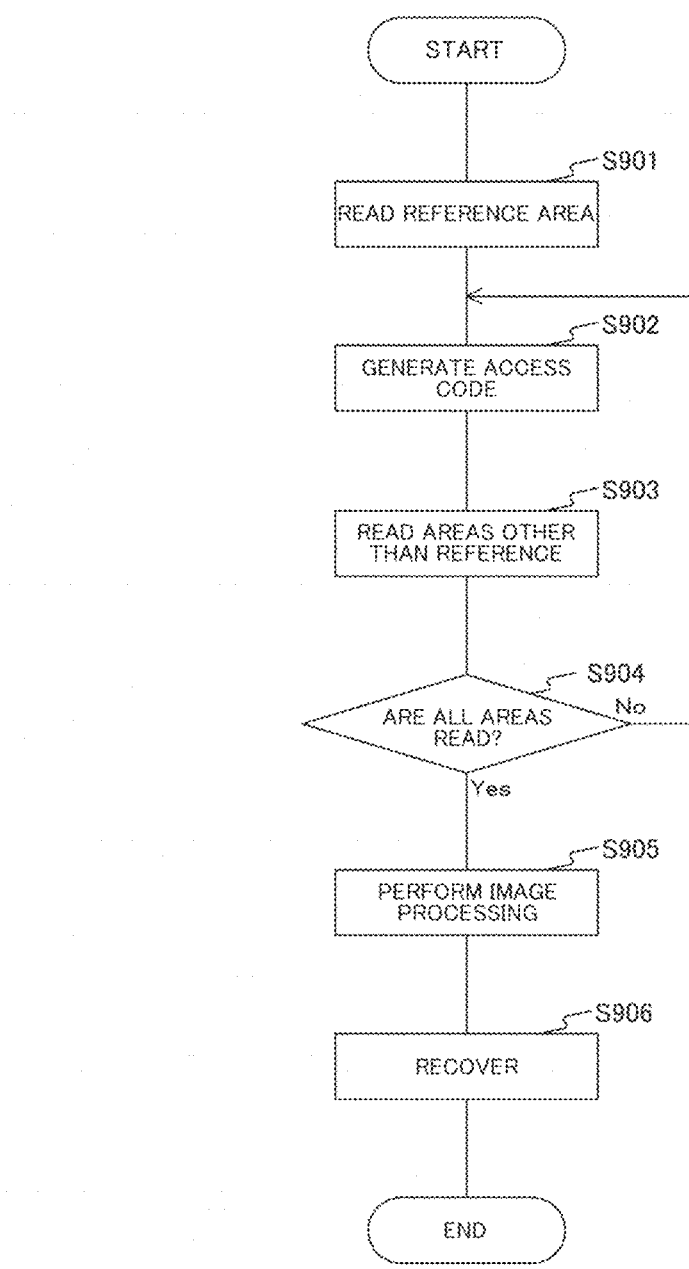
FIG. 25 is a flowchart illustrating an example of an operation of a solid-state image sensor according to the first embodiment of the present technology

FIG. 25 is a flowchart illustrating an example of an operation of the solid-state image sensor 200 according to the first embodiment of the present technology. This operation starts, for example, when a predetermined application for capturing image data is executed.

The solid-state image sensor 200 reads a pixel signal of a reference area in accordance with the reference access code (step S901). Then, the solid-state image sensor 200 generates the non-reference access code of a subsequent area through calculation of the access code of the reference source (step S902) and reads a pixel signal in accordance with the non-reference access code (step S903).

The solid-state image sensor 200 determines whether all the areas are read (step S904). When all the areas are not read (No in step S904), the solid-state image sensor 200 repeats steps subsequent to step S902.

Conversely, when all the areas are read (Yes in step S904), the solid-state image sensor 200 performs predetermined image processing on compressed image data (step S905) and performs recovery of the image data (step S906). After step S906, the solid-state image sensor 200 ends the imaging processing of one frame. When two or more frames are continuously captured, steps S901 to S906 are repeatedly performed in synchronization with a vertical synchronization signal.

In this way, according to the first embodiment of the present technology, the non-reference access code generation unit 220 generates the non-reference access code other than the specific area from the reference access code of the specific area. Therefore, it is possible to reduce a data amount of the retained access code. Accordingly it is possible to reduce a memory capacity necessary to retain the access code and a communication amount of an interface transmitting the access code.

2. Second Embodiment

In the above-described first embodiment, the H code generation unit 230 enables the analog-digital converter 261 in only the columns of the access destinations. In this configuration, however, the enabled analog-digital converter 261 and the disabled analog-digital converter 261 may coexist. Accordingly, there is concern of occurrence of noise caused since power is changed and a power source is changed. The solid-state image sensor 200 according to a second embodiment is different from that of the first embodiment in that the noise caused due to the change in power is inhibited.

Figure 26:
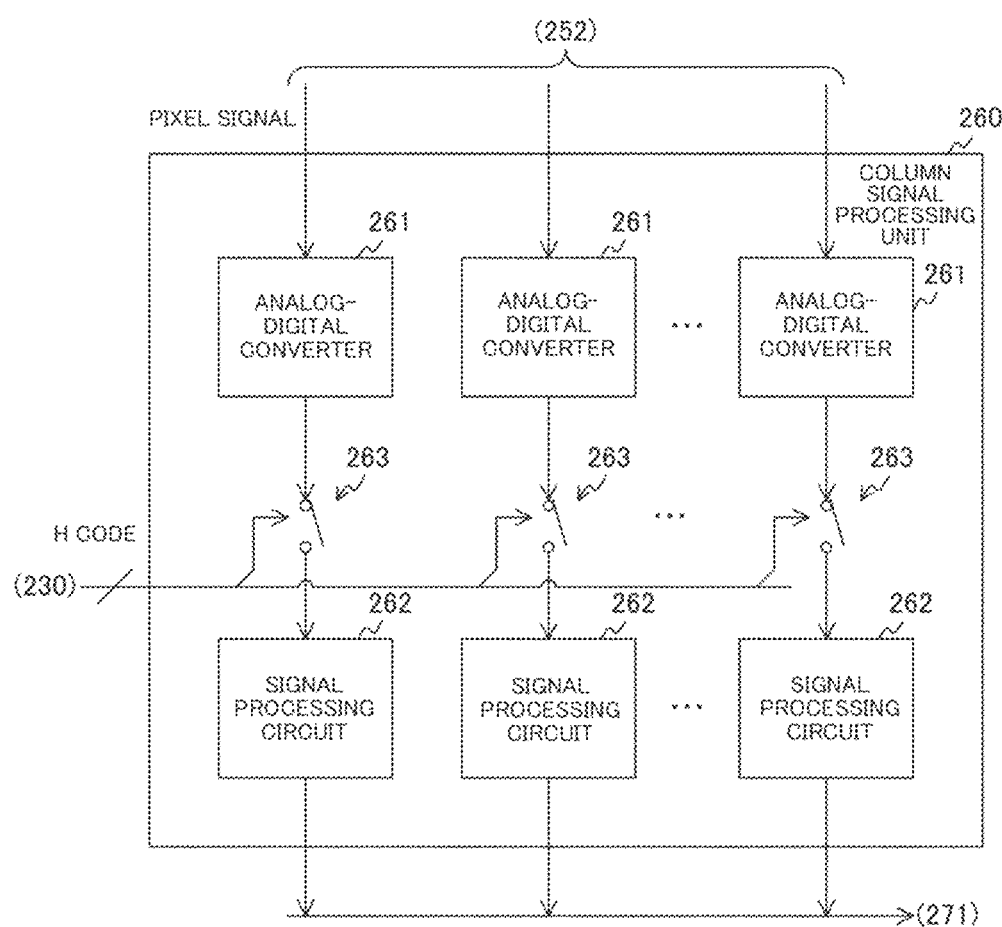
FIG. 26 is a block diagram illustrating an exemplary configuration of a column signal processing unit according to a second embodiment of the present technology.

FIG. 26 is a block diagram illustrating an exemplary configuration of the column signal processing unit 260 according to the second embodiment of the present technology. The column signal processing unit 260 according to the second embodiment is different from that of the first embodiment in that a plurality of switches 263 are further provided. The switch 263 is disposed at each column.

The H code generation unit 230 according to the second embodiment inputs bits of a corresponding column in the H code to each of eight switches 263 corresponding to an access target area.

When a bit from the H code generation unit 230 is "1", the switch 263 supplies pixel data from the corresponding analog-digital converter 261 to the corresponding signal processing circuit 262. Conversely, when a bit from the H code generation unit 230 is "0", the switch 263 does not output pixel data. That is, a group of the switches 263 selects only pixel data of the pixels designated as the access destinations and outputs the pixel data to the rear stage. A set of the switches 263 is an example of a selection unit described in the claims.

The analog-digital converters 261 in all the columns are enabled in accordance with disposition of the switches 263. Accordingly, power supplied to the analog-digital converters 261 becomes constant, and thus it is possible to inhibit noise caused due to the change in the power source.

In this way, according to the second embodiment of the present technology since the switches 263 selecting only the pixel data of the pixels designated as the access destinations are disposed, the analog-digital converters 261 in all the columns are enabled. Accordingly it is possible to inhibit noise caused due to a change in the power source compared to the enabled or disabled analog-digital converters 261 coexist.

3. Third Embodiment

In the above-described first embodiment, the imaging device 100 performs imaging and recovery of the image data. In this configuration, however, a processing amount or power consumption of the imaging device 100 may increase compared to the case in which only the imaging is performed. The third embodiment is different from the first embodiment in that the recovery is performed outside of the imaging device 100 according to the third embodiment.

Figure 27:
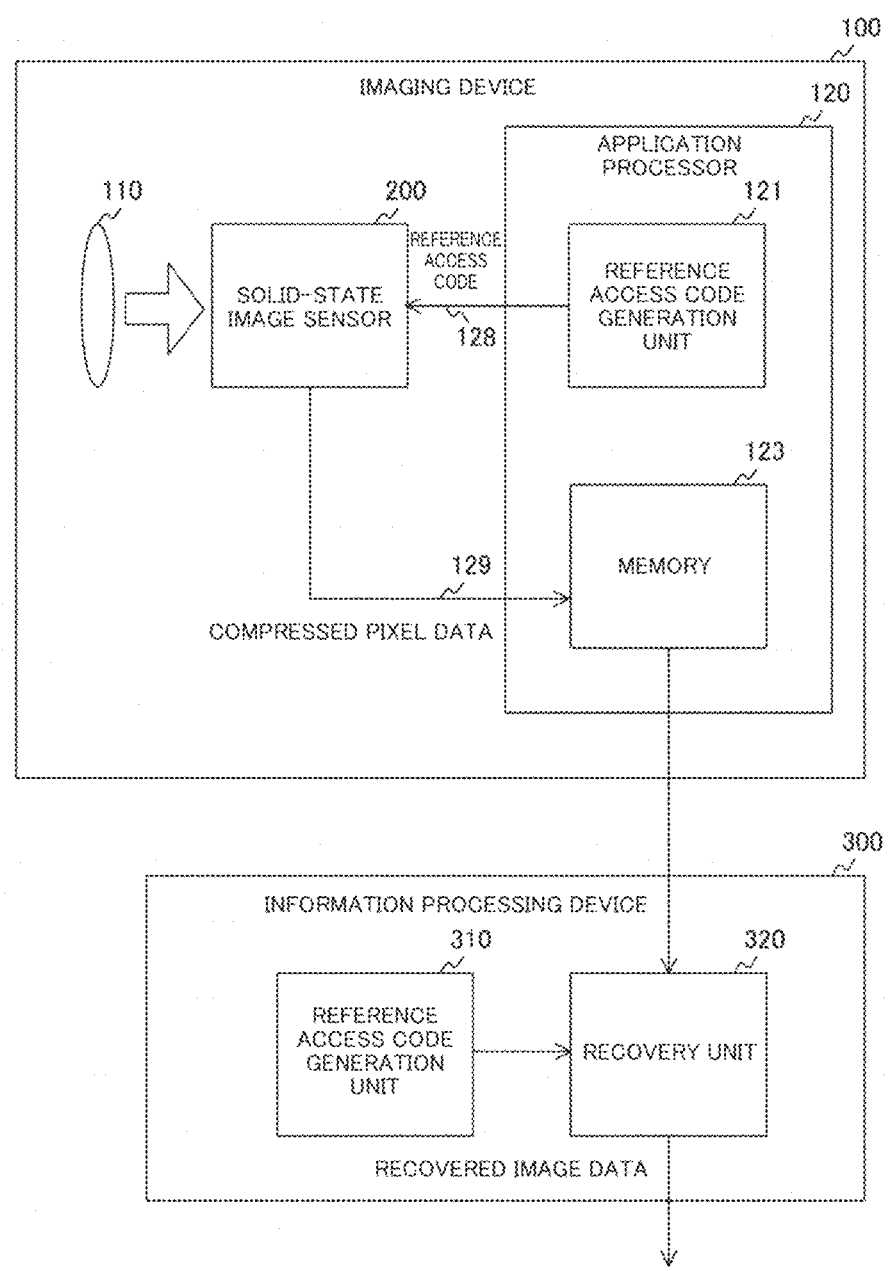
FIG. 27 is a block diagram illustrating an exemplary configuration of a signal processing system according to a third embodiment of the present technology.

FIG. 27 is a block diagram illustrating an exemplary configuration of a signal processing system according to the third embodiment of the present technology. In the signal processing system, the imaging device 100 and the information processing device 300 are disposed.

The imaging device 100 according to the third embodiment includes a memory 123 instead of the recovery unit 122. The memory 123 retains compressed image data. The imaging device 100 transmits compressed image data to the information processing device 300 via an interface (not illustrated) or an Internet line.

The information processing device 300 includes a reference access code generation unit 310 and a recovery unit 320. The configuration of the reference access code generation unit 310 and the recovery unit 320 is the same as the reference access code generation unit 121 and the recovery unit 122 according to the first embodiment.

Instead of the imaging device 100, the external information processing device 300 performs recovery, and thus it is possible to reduce a processing amount or power consumption of the imaging device 100.

The imaging device 100 can also retain the reference access code in the memory 123 and transmit the reference access code to the information processing device 300. In this case, the reference access code generation unit 310 is not necessary.

In this way, according to the third embodiment of the present technology, since the information processing device 300 performs recovery of image data, it is possible to reduce a processing amount or power consumption of the imaging device 100 compared to the case in which the imaging device 100 performs the recovery.

4. Fourth Embodiment

In the above-described first embodiment, the application processor 120 transmits the reference access code to the solid-state image sensor 200. However, when the solid-state image sensor 200 and the application processor 120 are disposed in separate devices, the recovered access codes are transmitted and received between these devices. Thus, it is not desirable from the viewpoint of keeping security. The signal processing system according to the fourth embodiment is different from that of the first embodiment in that the reference access code is not transmitted and received between devices.

Figure 28:
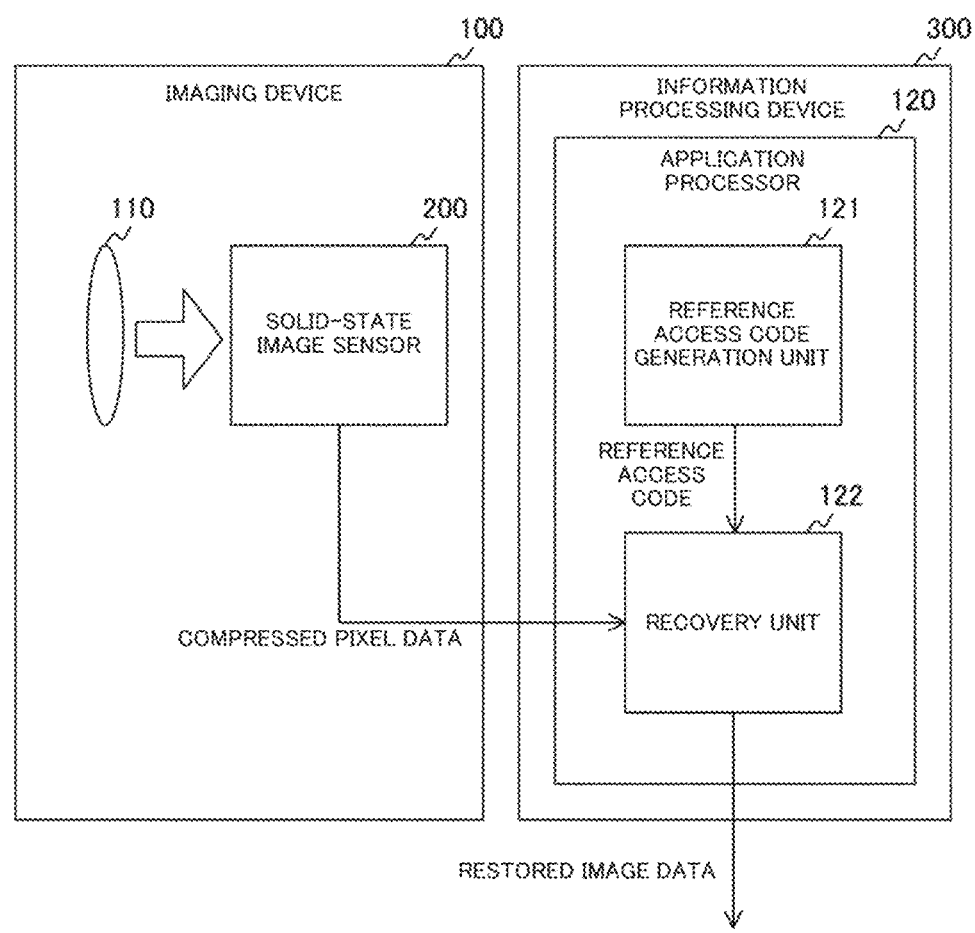
FIG. 28 is a block diagram illustrating an exemplary configuration of a signal processing system according to a fourth embodiment of the present technology.

FIG. 28 is a block diagram illustrating an exemplary configuration of a signal processing system according to the fourth embodiment of the present technology. In the signal processing system according to the fourth embodiment, the optical unit 110 and the solid-state image sensor 200 are disposed in the imaging device 100, and the application processor 120 is disposed in the information processing device 300. The application processor 120 does not transmit the reference access code to the imaging device 100. The reference access code is associated with the chip of the solid-state image sensor 200 and is generated from identification information of the chip based on a specification.

Figure 29:
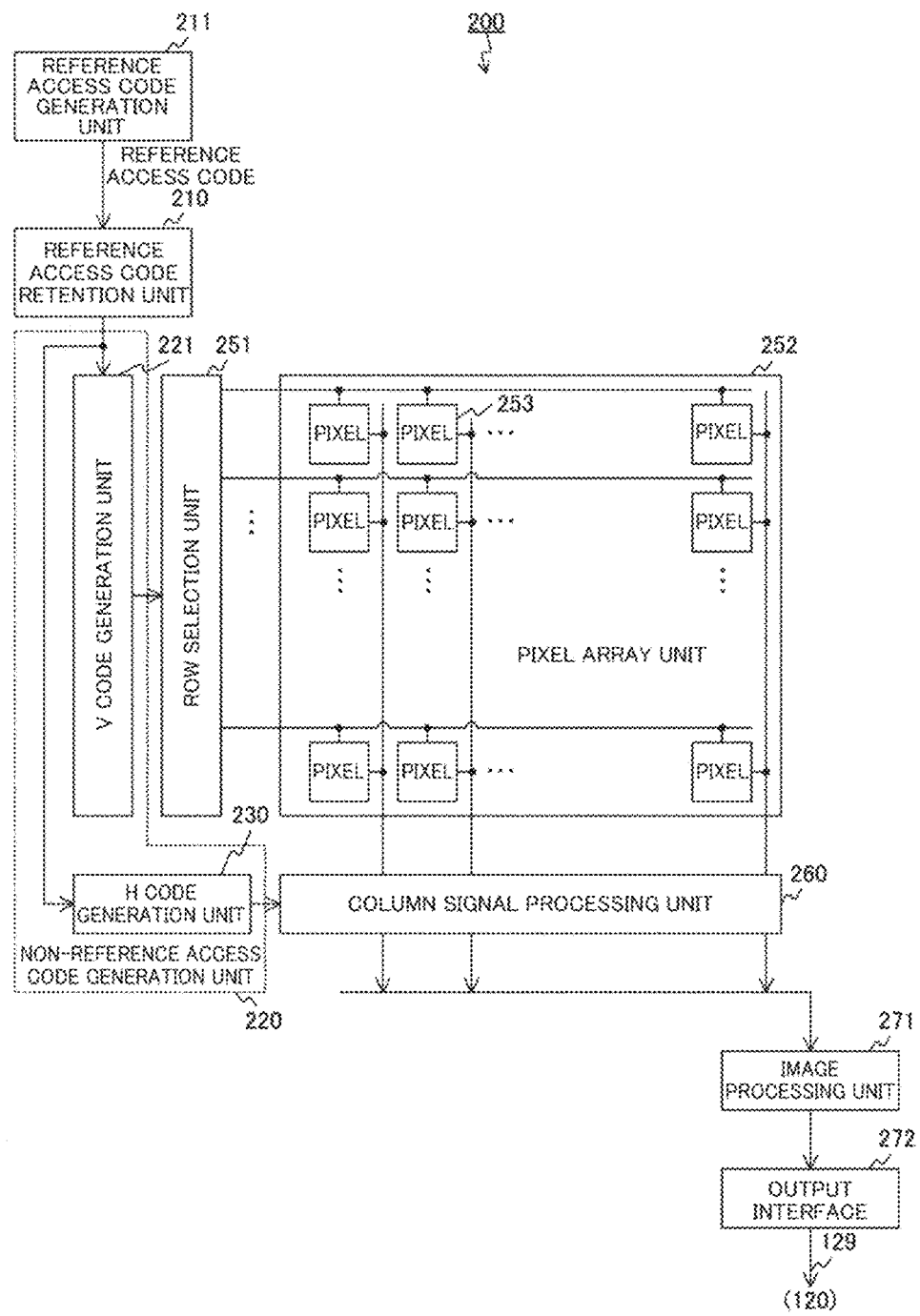
FIG. 29 is a block diagram illustrating an exemplary configuration of a solid-state image sensor according to a fourth embodiment of the present technology.

FIG. 29 is a block diagram illustrating an exemplary configuration of the solid-state image sensor 200 according to the fourth embodiment of the present technology. The solid-state image sensor 200 according to the fourth embodiment is different from that of the first embodiment in that a reference access code generation unit 211 is further included. The configuration of the reference access code generation unit 211 is similar to that of the reference access code generation unit 121 in the application processor 120. The reference access code generation unit 211 is an example of a first reference access code generation unit described in the claims. The reference access code generation unit 121 is an example of a second reference access code generation unit described in the claims.

As exemplified in the drawing, since the solid-state image sensor 200 generates the reference access code, it is not necessary for the application processor 120 to transmit the reference access code to the solid-state image sensor 200. Accordingly when the solid-state image sensor 200 and the application processor 120 are disposed in separate devices, the reference access code is not transmitted between these devices, Thus, security can be improved.

In this way, in the fourth embodiment of the present technology since the solid-state image sensor 200 generates the reference access code, it is not necessary for the application processor 120 to transmit the reference access code to the solid-state image sensor 200. Accordingly, security can be improved compared to the case in which the reference access code is transmitted and received.

5. Fifth Embodiment

In the above-described first embodiment, the application processor 120 generates and recovers the reference access code. In this configuration, however, a processing amount or power consumption of the application processor 120 increases compared to a case in which only the recovery is performed. The imaging device 100 according to a fifth embodiment is different from that of the first embodiment in that the solid-state image sensor 200 generates and transmits the reference access code.

Figure 30:
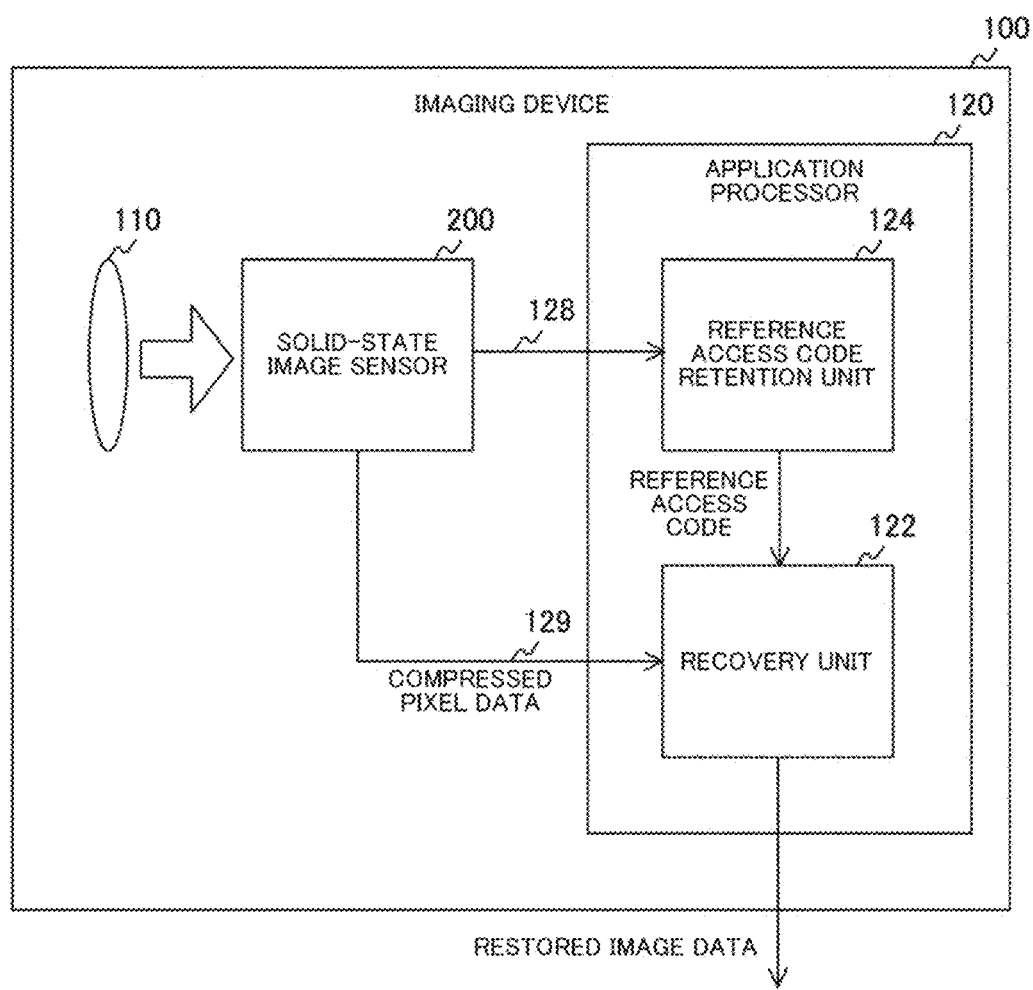
FIG. 30 is a block diagram illustrating an exemplary configuration of an imaging device according to a fifth embodiment of the present technology.

FIG. 30 is a block diagram illustrating an exemplary configuration of the imaging device 100 according to the fifth embodiment of the present technology. The imaging device according to the fifth embodiment is different from that of the first embodiment in that the application processor 120 includes a reference access code retention unit 124 instead of the reference access code generation unit 121.

The solid-state image sensor 200 according to the fifth embodiment is similar to that of the fourth embodiment. The solid-state image sensor 200 according to the fifth embodiment generates the reference access code and transmits the reference access code to the application processor 120. Therefore, it is not necessary for the application processor 120 to generate the reference access code, and thus it is possible to reduce a processing amount or power consumption of the application processor 120.

In this way, in the fifth embodiment of the present technology the solid-state image sensor 200 generates the reference access code and transmits the reference access code to the application processor 120. Therefore, it is not necessary for the application processor 120 to generate the reference access code. Accordingly, compared to a case in which the application processor 120 generates the reference access code, it is possible to reduce a processing amount or power consumption of the application processor 120.

6. Application Example to Mobile Object

The technology (the present technology) of the present disclosure can be applied to various products. For example, the technology of the present disclosure may be implemented as a device mounted in any type of mobile object such as an automobile, an electric automobile, a motorbike, a hybrid electric automobile, a bicycle, a personal mobility an airplane, a drone, a ship, and a robot.

Figure 31:
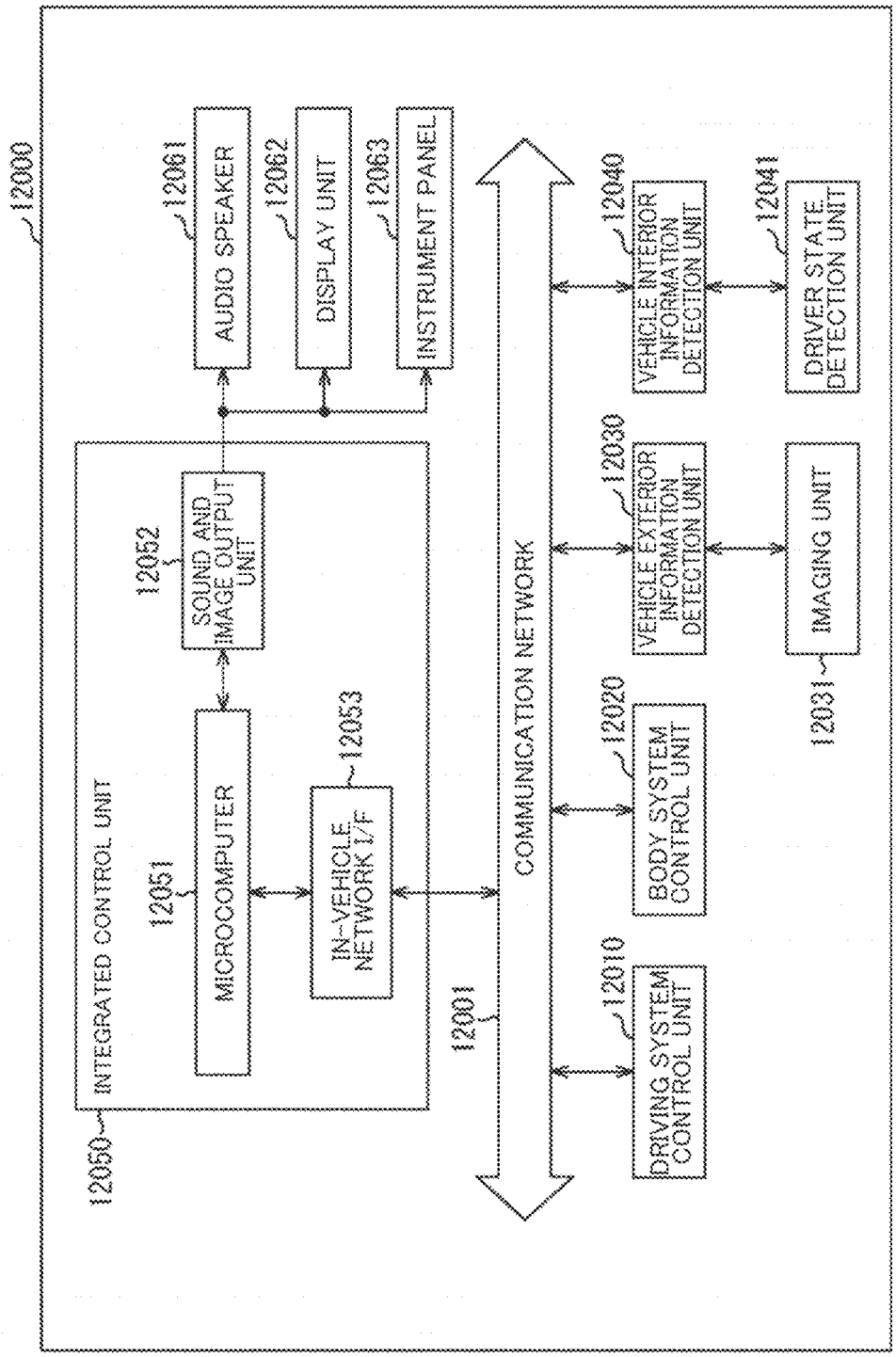
FIG. 31 is a block diagram illustrating an exemplary overall configuration of a vehicle control system.

FIG. 31 is a block diagram illustrating an exemplary overall configuration of a vehicle control system which is an example of a mobile object control system to which the technology of the present disclosure is applied.

A vehicle control system 12000 includes a plurality of electronic control units connected via a communication network 12001. In an example illustrated in FIG. 31, the vehicle control system 12000 includes a driving system control unit 12010, a body system control unit 12020, a vehicle exterior information detection unit 12030, a vehicle interior information detection unit 12040, and an integrated control unit 12050. A microcomputer 12051, a sound and image output unit 12052, and an in-vehicle network interface (I/F) 12053 are illustrated as a functional configuration of the integrated control unit 12050.

The driving system control unit 12010 controls an operation of a device related to a driving system of a vehicle in accordance with various programs. For example, the driving system control unit 12010 functions as a control device such as a driving force generation device generating a driving force of a vehicle, such as an internal combustion engine or a driving motor, a driving force transmission mechanism transmitting a driving force to wheels, a steering mechanism adjusting a rudder angle of a vehicle, and a braking device generating a braking force of a vehicle.

The body system control unit 12020 controls operations of various devices equipped in a vehicle in accordance with various programs. For example, the body system control unit 12020 functions as a keyless entry system, a smart key system, a power window device, or a control device of various lamps such as a head lamp, a back lamp, a brake lamp, a blinker, or a fog lamp. In this case, radio waves transmitted from a portable device substituting for a key or signals from various switches can be input to the body system control unit 12020. The body system control unit 12020 receives an input of such radio waves or signals and controls a door locking device, a power window device, lamps, and the like of a vehicle.

The vehicle exterior information detection unit 12030 detects external information of a vehicle in which the vehicle control system 12000 is mounted. For example, the imaging unit 12031 is connected to the vehicle exterior information detection unit 12030. The vehicle exterior information detection unit 12030 causes the imaging unit 12031 to capture images outside of the vehicle and receives captured images. The vehicle exterior information detection unit 12030 may perform a distance detection process or an object detection process for people, vehicles, obstacles, and characters of signs or roads based on the received images.

The imaging unit 12031 is an optical sensor that receives light and outputs an electric signal in accordance with an amount of received light. The imaging unit 12031 can output the electric signal as an image or can also output the electric signal as ranging information. The light received by the imaging unit 12031 may be visible light or invisible light such as infrared light.

The vehicle interior information detection unit 12040 detects vehicle interior information. For example, a driver state detection unit 12041 detecting a state of a driver is connected to the vehicle interior information detection unit 12040. The driver state detection unit 12041 includes, for example, a camera that images a driver. The vehicle interior information detection unit 12040 may calculate the degree of fatigue or the degree of concentration of the driver or may determine whether the drive is drowsing based on detected information input from the driver state detection unit 12041.

The microcomputer 12051 can calculate a control target value of the driving force generation device, the steering mechanism, or the braking device based on vehicle interior or exterior information acquired by the vehicle exterior information detection unit 12030 or the vehicle interior information detection unit 12040 and can output a control instruction to the driving system control unit 12010. For example, the microcomputer 12051 can perform cooperated control in order to implement functions of an advanced driver assistance system (ADAS) including collision avoidance or collision absorption of a vehicle, following travel based on an inter-vehicle distance, a vehicle speed keeping travel, a vehicle collision warning, or a vehicle lane deviation warning.

The microcomputer 12051 can perform cooperated control in order to perform automated driving or the like in which a vehicle autonomously travels without a manipulation of a driver by controlling the driving force generation device, the steering mechanism, the braking device, or the like based on surrounding information of the vehicle acquired by the vehicle exterior information detection unit 12030 or the vehicle interior information detection unit 12040.

The microcomputer 12051 can output a control instruction to the body system control unit 12020 based on vehicle exterior information acquired by the vehicle exterior information detection unit 12030. For example, the microcomputer can control a head lamp in accordance with a position of a front vehicle or an oncoming vehicle detected by the vehicle exterior information detection unit 12030 and can perform cooperated control in order to achieve antiglare such as switching of a high beam to a low beam.

The sound and image output unit 12052 transmits an output signal of at least one of a sound and an image to an output device capable of notifying an occupant of a vehicle or the outside of the vehicle of information visually or auditorily. In the example of FIG. 31, an audio speaker 12061, a display unit 12062, and an instrument panel 12063 are exemplified as output devices. The display unit 12062 may include, for example, at least one of an onboard display and a head-up display.

Figure 32:
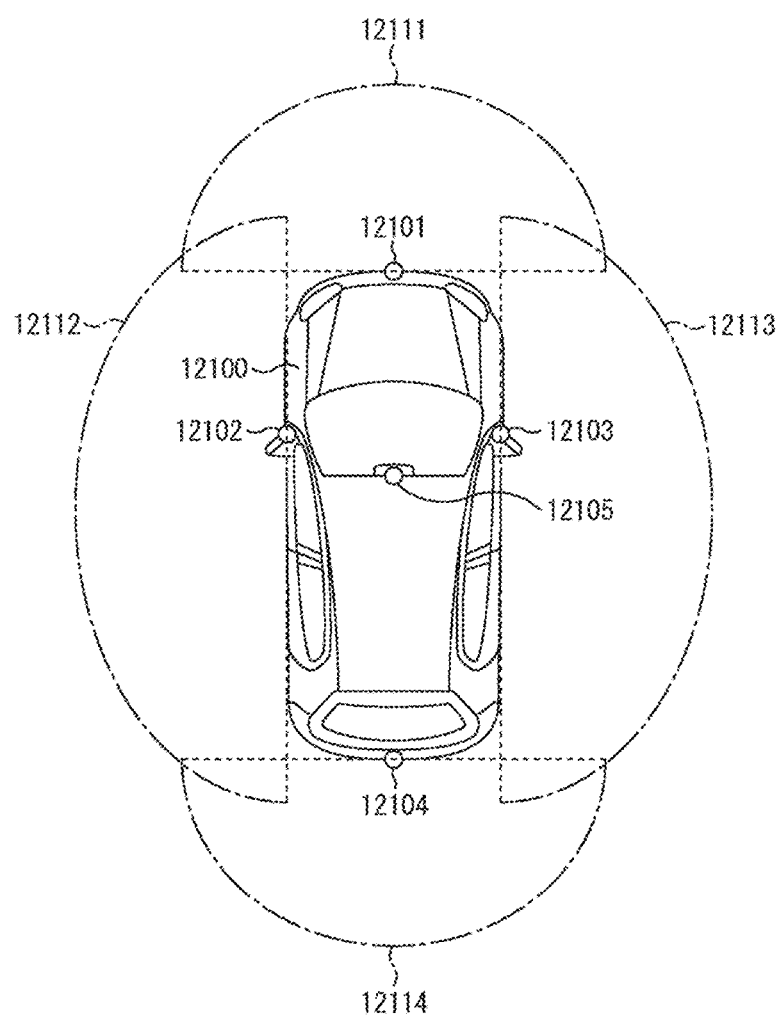
FIG. 32 is a diagram illustrating examples of positions at which a vehicle exterior information detection unit and an imaging unit are installed.

FIG. 32 is a diagram illustrating examples of positions at which the imaging units are installed.

In FIG. 32, imaging units 12101, 12102, 12103, 12104, and 12105 are included as the imaging unit 12031.

The imaging units 12101, 12102, 12103, 12104, and 12105 are provided at, for example, positions of a front nose, side mirrors, a rear bumper, a back door, an upper portion of a vehicle interior front glass, and the like of a vehicle 12100. The imaging unit 12101 provided on a front nose and the imaging unit 12105 provided in an upper portion of the vehicle interior front glass mainly acquire images in front of the vehicle 12100. The imaging units 12102 and 12103 provided on the side mirrors mainly acquire images on the lateral side of the vehicle 12100. The imaging unit 12104 provided on the rear bumper or the back door mainly acquires images in the rear of the vehicle 12100, The imaging unit 12105 provided on the upper portion of the vehicle interior front glass is used to mainly detect front vehicles, pedestrians, obstacles, traffic signals, traffic signs, lanes, or the like.

In FIG. 32, examples of imaging ranges of the imaging units 12101 to 12104 are illustrated. An imaging range 12111 is an imaging range of the imaging unit 12101 provided on the front nose, imaging ranges 12112 and 12113 are imaging ranges of the imaging units 12102 and 12103 provided in the side mirrors, and an imaging range 12114 is an imaging range of the imaging unit 12104 provided in the rear bumper or the back door. For example, by superimposing image data captured by the imaging units 12101 to 12104, it is possible to obtain a bird's-eye view image viewed from the upper side of the vehicle 12100.

At least one of the imaging units 12101 to 12104 may have a function of acquiring distance information. For example, at least one of the imaging units 12101 to 12104 may be a stereo camera formed by a plurality of image sensors or may be an image sensor that has phase difference detection pixels.

For example, the microcomputer 12051 can extract a 3-dimensional object traveling at a predetermined speed (for example, 0 or more km/h) in substantially the same direction as the vehicle 12100 particularly in a 3-dimensional object closest to a travel road of the vehicle 12100 as a front vehicle by obtaining a distance to each 3-dimensional object in the imaging ranges 12111 to 12114 and a change (a relative speed to the vehicle 12100) in the distance over time based on distance information obtained from the imaging units 12101 to 12104. Further, the microcomputer 12051 can set an inter-vehicle distance which should be guaranteed in advance in front of a front vehicle and can perform automated brake control (also including following stop control) or automated acceleration control (also including following start control). In this way it is possible to perform cooperated control in order to perform automated driving or the like in which a vehicle autonomously travels irrespective of a manipulation of a driver.

For example, the microcomputer 12051 can classify and extract 3-dimensional data regarding 3-dimensional objects into a two-wheeled vehicle, a normal vehicle, a large vehicle, a pedestrian, and other 3-dimensional objects such as an electric pole based on distance information obtained from the imaging units 12101 to 12104 and can use the 3-dimensional data to perform automated avoidance of obstacles. For example, the microcomputer 12051 identifies surrounding obstacles of the vehicle 12100 as obstacles which can be viewed by the driver of the vehicle 12100 and obstacles which are difficult to view. The microcomputer 12051 determines a collision risk indicating the degree of danger of collision with each obstacle. In a situation in which there is a collision possibility of the collision risk equal to or greater than a set value, a warning is output to a driver via the audio speaker 12061 or the display unit 12062, or forced deceleration or avoidance steering is performed through the driving system control unit 12010, Thus, it is possible to perform driving support for collision avoidance.

At least one of the imaging units 12101 to 12104 may be an infrared camera that detects infrared light. For example, the microcomputer 12051 can recognize pedestrians by determining whether the pedestrians are in images captured by the imaging units 12101 to 12104. The recognition of the pedestrians is performed, for example, in a procedure of extracting feature points in the images captured by the imaging units 12101 to 12104 serving as infrared cameras and a procedure of determining whether there are pedestrians by performing pattern matching processing on the series of feature points indicating the contours of objects. When the microcomputer 12051 determines that pedestrians are in the images captured by the imaging units 12101 to 12104 and recognize the pedestrians, the sound and image output unit 12052 controls the display unit 12062 such that rectangular contour lines for emphasis are superimposed on the recognized pedestrians. The sound and image output unit 12052 may control the display unit 12062 such that icons or the like indicating pedestrians are displayed at desired positions.

The examples of the vehicle control system to which the technology of the present disclosure can be applied have been described. The technology of the present disclosure can be applied to the imaging unit 12031 in the above-described configurations. Specifically the imaging device 100 in FIG. 1 can be applied to the imaging unit 12031. By applying the technology related to the present disclosure to the imaging unit 12031, it is possible to reduce a data amount of the access codes and it is possible to reduce a memory capacity or a communication amount of the vehicle control system.

The above-described embodiments are examples given to embody the present technology and the factors in the embodiment and specific factors of the claims have correspondent relations. Similarly, specific factors of the invention in the claims and factors in the embodiments of the present technology in which the same names as those of the specific factors are given have correspondent relations. The present technology is not limited to the embodiments and can be modified and embodied in various forms within the scope of the present technology without departing from the gist of the present technology.

The advantageous effects described in the present specification are merely exemplary and are not limited, and other advantageous effects may be obtained.

The present technology can be configured as follows.

(1) A sensing device including:
   a pixel array unit in which a plurality of areas each including a predetermined number of pixels are arrayed;
   a reference access code retention unit configured to retain a reference access code for designating, as access destinations, some of the pixels in a specific area among the plurality of areas;
   a non-reference access code generation unit configured to generate a non-reference access code for designating, as access destinations, the pixels in an area which does not correspond to the specific areas among the plurality of areas from the reference access code; and
      a signal processing unit configured to generate pixel data of pixels designated with the reference access code and the non-reference access code.

(2) The sensing device according to (1), wherein the non-reference access code generation unit generates the non-reference access code in an area adjacent to the specific area among the plurality of areas.

(3) The sensing device according to (1) or (2), wherein the non-reference access code generation unit generates the non-reference access code in an area nonadjacent to the specific area among the plurality of areas.

(4) The sensing device according to any one of (1) to (3), wherein the non-reference access code generation unit generates a first non-reference access code from the reference access code in a first area which does not correspond to the specific area, and generates a second non-reference access code from the first non-reference access code in a second area which does not correspond to the specific area.

(5) The sensing device according to any one of (1) to (4), wherein the non-reference access code generation unit generates the non-reference access code from the reference access code in a specific area of a second frame.

(6) The sensing device according to any one of (1) to (5), wherein the non-reference access code generation unit generates the non-reference access code through predetermined calculation processing on the reference access code.

(7) The sensing device according to (6),
   wherein the reference access code includes a bit sequence in which a predetermined number of bits are arrayed, and wherein the calculation processing includes processing for inverting each of the bits.

(8) The sensing device according to (6) or (7),
   wherein the reference access code includes a bit sequence in which a predetermined number of bits are arrayed, and
   wherein the calculation processing includes processing for inverting an order of the bits.

(9) The sensing device according to any one of (6) to (8),
   wherein the reference access code includes a bit sequence in which a predetermined number of bits are arrayed, and
   wherein the calculation processing includes cyclic shifting in the bit sequence.

(10) The sensing device according to (9), wherein the predetermined number of pixels are arrayed in accordance with a Bayer array.

(11) The sensing device according to (10), wherein a shift number of the cyclic shifting is odd.

(12) The sensing device according to any one of (1) to (11), wherein the signal processing unit includes a plurality of analog-digital converters converting analog signals coming from the pixels into the pixel data.

(13) The sensing device according to (12), wherein the plurality of analog-digital converters convert the analog signals of pixels designated with the reference access code and the non-reference access code into the pixel data.

(14) The sensing device according to (12), wherein the signal processing unit further includes a selection unit selecting and outputting pixel data of pixels designated with the reference access code and the non-reference access code among the pixel data of the plurality of analog-digital converters.

(15) A signal processing system including:
   a pixel array unit in which a plurality of areas each including a predetermined number of pixels are arrayed;
   a reference access code retention unit configured to retain a reference access code for designating, as access destinations, some of the pixels in a specific area among the plurality of areas;
   a non-reference access code generation unit configured to generate a non-reference access code for designating, as access destinations, the pixels in an area which does not correspond to the specific areas among the plurality of areas from the reference access code;
   a signal processing unit configured to generate pixel data of the pixels designated with the reference access code and the non-reference access code; and
   a recovery unit configured to recover image data based on the pixel data.

(16) The signal processing system according to (15),
   wherein the pixel array unit, the reference access code retention unit, the non-reference access code generation unit, and the signal processing unit are disposed in a sensing device, and
   wherein the recovery unit is disposed in an application processor.

(17) The signal processing system according to (15),
   wherein the pixel array unit, the reference access code retention unit, the non-reference access code generation unit, and the signal processing unit are disposed in an imaging device, and
   wherein the recovery unit is disposed in an information processing device.

(18) The signal processing system according to (15), further including: first and second reference access code generation units configured to generate the reference access code,
   wherein the pixel array unit, the first reference access code generation unit, the reference access code retention unit, the non-reference access code generation unit, and the signal processing unit are disposed in an imaging device, and wherein the second reference access code generation unit and the recovery unit are disposed in an information processing device.

(19) The signal processing system according to (15),
   a reference access code generation unit configured to generate the reference access code,
   wherein the pixel array unit, the reference access code retention unit, the non-reference access code generation unit, the signal processing unit, and the reference access code generation unit are disposed in a sensing device, and wherein the recovery unit is disposed in an application processor.

(20) A method of controlling a sensing device including:
a reference access code reading procedure of reading a reference access code from a reference access code retention unit that retains the reference access code for designating, among a plurality of areas each including a predetermined number of pixels, some of the pixels in a specific area as access destinations;
a non-reference access code generation procedure of generating a non-reference access code for designating, as access destinations, the pixels in an area which does not correspond to the specific areas among the plurality of areas from the reference access code; and
a signal processing procedure of generating pixel data of pixels designated with the reference access code and the non-reference access code.

REFERENCE SIGNS LIST

100 Imaging device
110 Optical unit
120 Application processor
121, 211, 310 Reference access code generation unit
122, 320 Recovery unit
123 Memory
124, 210 Reference access code retention unit
200 Solid-state image sensor
201 Light-receiving chip
202 Circuit chip
220 Non-reference access code generation unit
221 V code generation unit
230 H code generation unit
231 Line counter
232 H code calculation unit
251 Row selection unit
252 Pixel array unit
253 Pixel
255 Area
260 Column signal processing unit
261 Analog-digital converter
262 Signal processing circuit
263 Switch
271 Image processing unit
272 Output interface
300 Information processing device
12031 Imaging unit

The invention claimed is:

1. A sensing device comprising:
a pixel array circuit in which a plurality of areas each including a predetermined number of pixels are arrayed, and
at least one processor configured to:
retain a reference access code for designating, as access destinations, some of the pixels in a specific area among the plurality of areas;
generate a non-reference access code for designating, as access destinations, the pixels in an area which does not correspond to the specific area among the plurality of areas from the reference access code; and
generate pixel data of pixels designated with the reference access code and the non-reference access code, wherein
generating the non-reference access code is performed through calculation processing on the reference access code,
the reference access code includes a bit sequence in which a predetermined number of bits are arrayed, and
the calculation processing includes processing for inverting each of the bits.

2. The sensing device according to claim 1, wherein the non-reference access code is generated in an area adjacent to the specific area among the plurality of areas.

3. The sensing device according to claim 1, wherein the non-reference access code is generated in an area nonadjacent to the specific area among the plurality of areas.

4. The sensing device according to claim 1, wherein generating the non-reference access code includes generating a first non-reference access code from the reference access code in a first area which does not correspond to the specific area, and generating a second non-reference access code from the first non-reference access code in a second area which does not correspond to the specific area.

5. The sensing device according to claim 1, wherein the non-reference access code is generated from the reference access code in a specific area of a second frame.

6. The sensing device according to claim 1, further comprising a plurality of analog-digital converters converting analog signals coming from the pixels into the pixel data.

7. The sensing device according to claim 6, wherein the plurality of analog-digital converters convert the analog signals of pixels designated with the reference access code and the non-reference access code into the pixel data.

8. The sensing device according to claim 6, further comprising a selection circuit for selecting and outputting pixel data of pixels designated with the reference access code and the non-reference access code among the pixel data of the plurality of analog-digital converters.

9. A signal processing system comprising the sensing device according to claim 1.

10. A sensing device comprising:
a pixel array circuit in which a plurality of areas each including a predetermined number of pixels are arrayed, and
at least one processor configured to:
retain a reference access code for designating, as access destinations, some of the pixels in a specific area among the plurality of areas;
generate a non-reference access code for designating, as access destinations, the pixels in an area which does not correspond to the specific area among the plurality of areas from the reference access code; and
generate pixel data of pixels designated with the reference access code and the non-reference access code, wherein
generating the non-reference access code is performed through calculation processing on the reference access code,
the reference access code includes a bit sequence in which a predetermined number of bits are arrayed, and
the calculation processing includes processing for inverting an order of the bits.

11. A signal processing system comprising the sensing device according to claim 10.

12. A sensing device comprising:
a pixel array circuit in which a plurality of areas each including a predetermined number of pixels are arrayed, and
at least one processor configured to:
retain a reference access code for designating, as access destinations, some of the pixels in a specific area among the plurality of areas;
generate a non-reference access code for designating, as access destinations, the pixels in an area which does not correspond to the specific area among the plurality of areas from the reference access code; and generate pixel data of pixels designated with the reference access code and the non-reference access code, wherein generating the non-reference access code is performed through calculation processing on the reference access code, the reference access code includes a bit sequence in which a predetermined number of bits are arrayed, and the calculation processing includes cyclic shifting in the bit sequence.

13. The sensing device according to claim 12, wherein the predetermined number of pixels are arrayed in accordance with a Bayer array.

14. The sensing device according to claim 13, wherein a shift number of the cyclic shifting is odd.

15. A signal processing system comprising the sensing device according to claim 12.

* * * * *